United States Patent
Yu

(10) Patent No.: US 11,966,078 B2
(45) Date of Patent: Apr. 23, 2024

(54) OPTOELECTRONIC DEVICE AND METHOD OF MANUFACTURE THEREOF

(71) Applicant: ROCKLEY PHOTONICS LIMITED, Altrincham (GB)

(72) Inventor: Guomin Yu, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 470 days.

(21) Appl. No.: 17/312,335

(22) PCT Filed: Dec. 9, 2019

(86) PCT No.: PCT/EP2019/084274
§ 371 (c)(1),
(2) Date: Jun. 9, 2021

(87) PCT Pub. No.: WO2020/120414
PCT Pub. Date: Jun. 18, 2020

(65) Prior Publication Data
US 2022/0050247 A1    Feb. 17, 2022

Related U.S. Application Data

(60) Provisional application No. 62/777,632, filed on Dec. 10, 2018.

(51) Int. Cl.
*G02B 6/122* (2006.01)
*G02B 6/14* (2006.01)
(Continued)

(52) U.S. Cl.
CPC .............. *G02B 6/1228* (2013.01); *G02B 6/14* (2013.01); *H01S 5/026* (2013.01); *H01S 5/1014* (2013.01)

(58) Field of Classification Search
CPC ......... G02B 6/1228; G02B 6/14; H01S 5/026; H01S 5/1014
See application file for complete search history.

(56) References Cited

U.S. PATENT DOCUMENTS 9,496,431 B2 * 11/2016 Krasulick ........... H01S 5/02325
2016/0327759 A1 11/2016 Keyvaninia et al.
(Continued)

FOREIGN PATENT DOCUMENTS

CN    1604306 A    4/2005
CN    102171606 A    8/2011
(Continued)

OTHER PUBLICATIONS

U.K. Intellectual Property Office Examination Report, dated May 13, 2022, for Patent Application No. GB2109762.1, 3 pages.
(Continued)

*Primary Examiner* — Jonathan Han
(74) *Attorney, Agent, or Firm* — Lewis Roca Rothgerber Christie LLP

(57) ABSTRACT

A method of manufacturing an optoelectronic device including a mode converter. The method has the steps of: on a first silicon-on-insulator (SOI) wafer, manufacturing the optoelectronic device; and either: on a second SOI wafer, manufacturing a mode converter; and bonding the mode converter to the first SOI wafer; or bonding a second SOI wafer to the first SOI wafer to form a combined wafer; and etching a mode converter into the combined wafer.

25 Claims, 29 Drawing Sheets

(51) Int. Cl.
    *H01S 5/026*     (2006.01)
    *H01S 5/10*     (2021.01)

(56) References Cited

U.S. PATENT DOCUMENTS

2017/0207600 A1    7/2017    Klamkin et al.
2020/0183085 A1*    6/2020    Mentovich ........... G02B 6/1223

FOREIGN PATENT DOCUMENTS

| | | |
|---|---|---|
| CN | 103235363 A | 8/2013 |
| CN | 103998961 A | 8/2014 |
| CN | 105359014 A | 2/2016 |
| CN | 106104749 A | 11/2016 |
| CN | 107329208 A | 11/2017 |
| WO | WO 2018/011587 A1 | 1/2018 |

OTHER PUBLICATIONS

International Search Report and Written Opinion of the International Searching Authority, dated Mar. 4, 2020, Corresponding to PCT/EP2019/084274, 8 pages.
Chinese Notification of the First Office Action, for Patent Application No. 201980091718.7, mailed Oct. 18, 2023, 10 pages.
Partial English translation of the Chinese Notification of the First Office Action, for Patent Application No. 201980091718.7, mailed Oct. 18, 2023, 14 pages.

\* cited by examiner

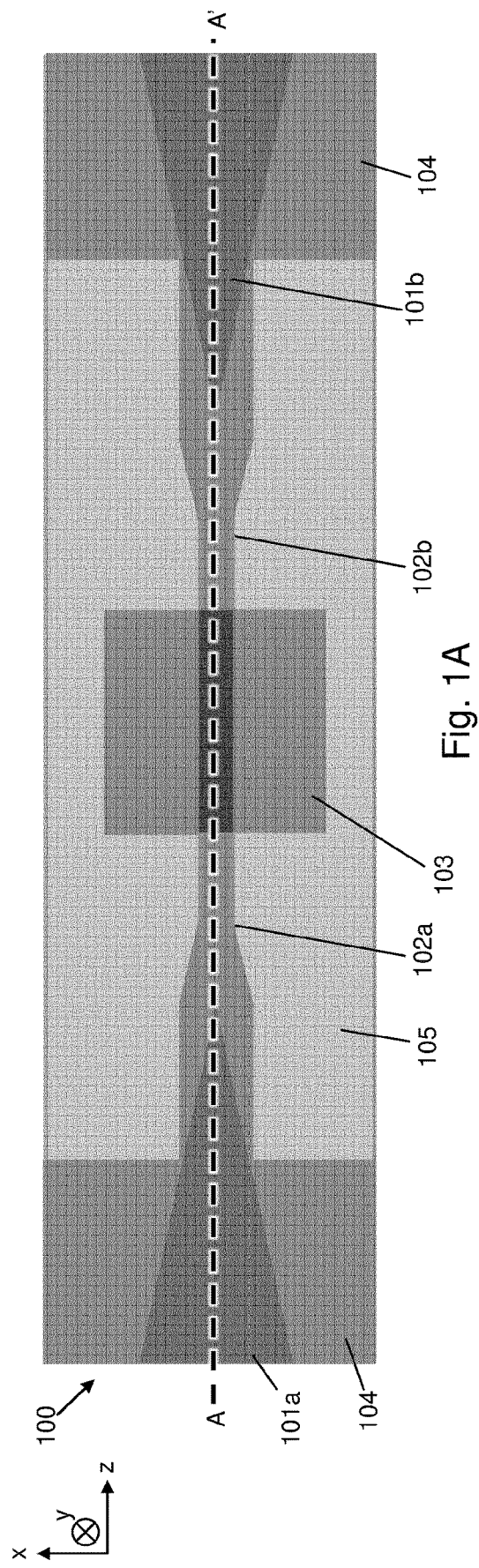
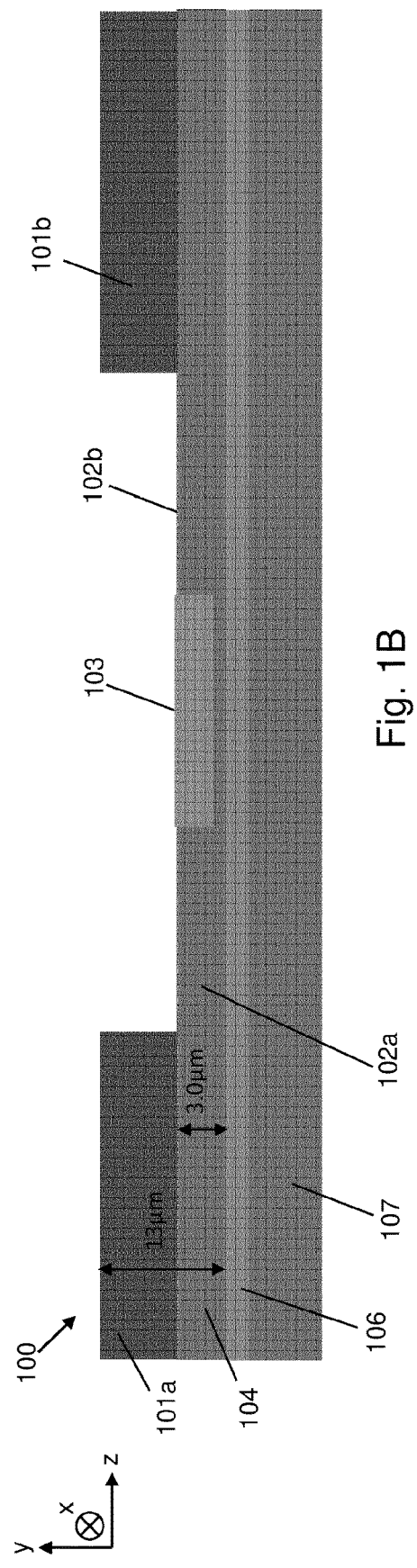
Fig. 1A
Fig. 1B

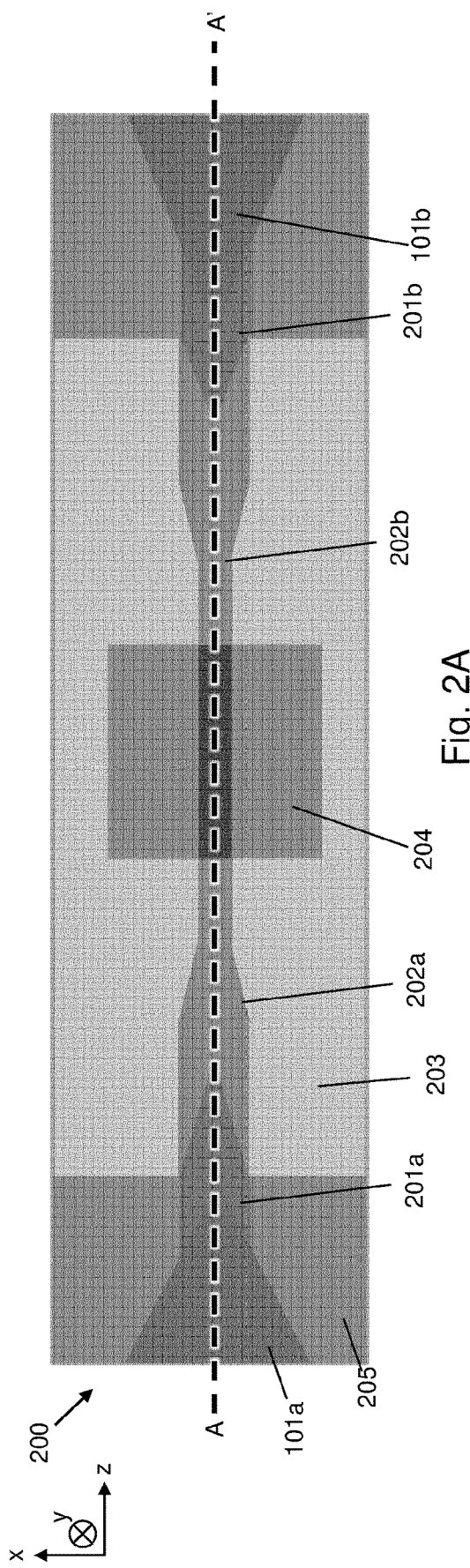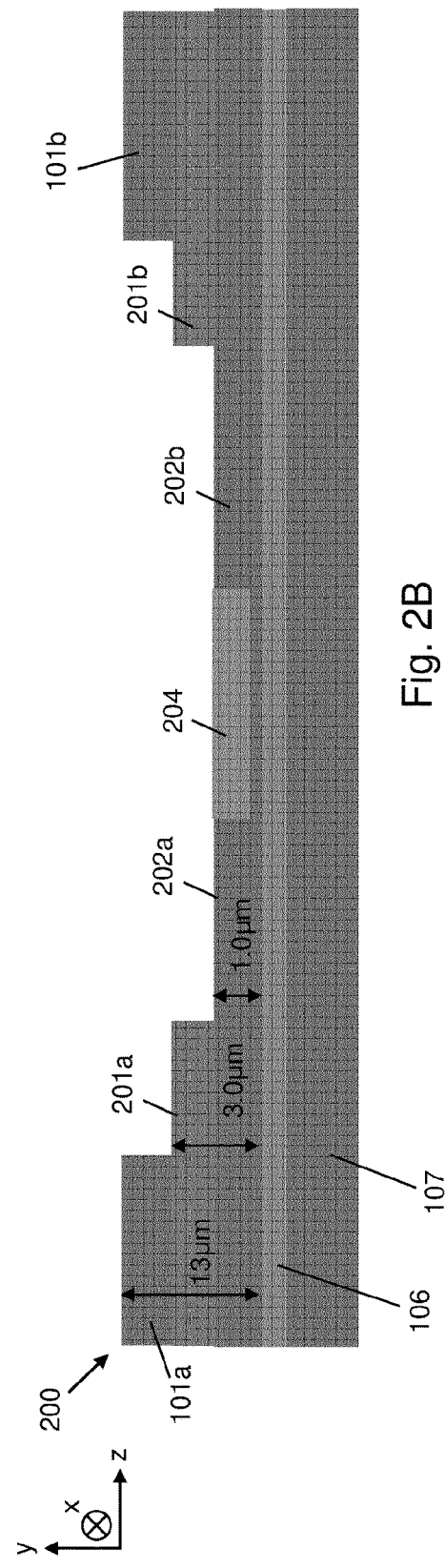
Fig. 2A
Fig. 2B

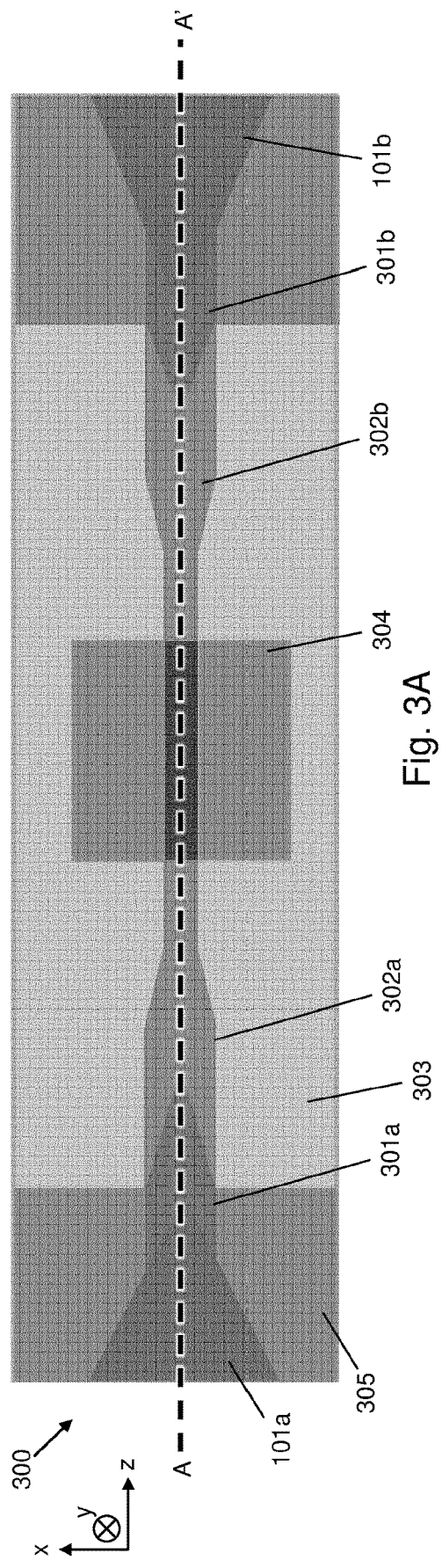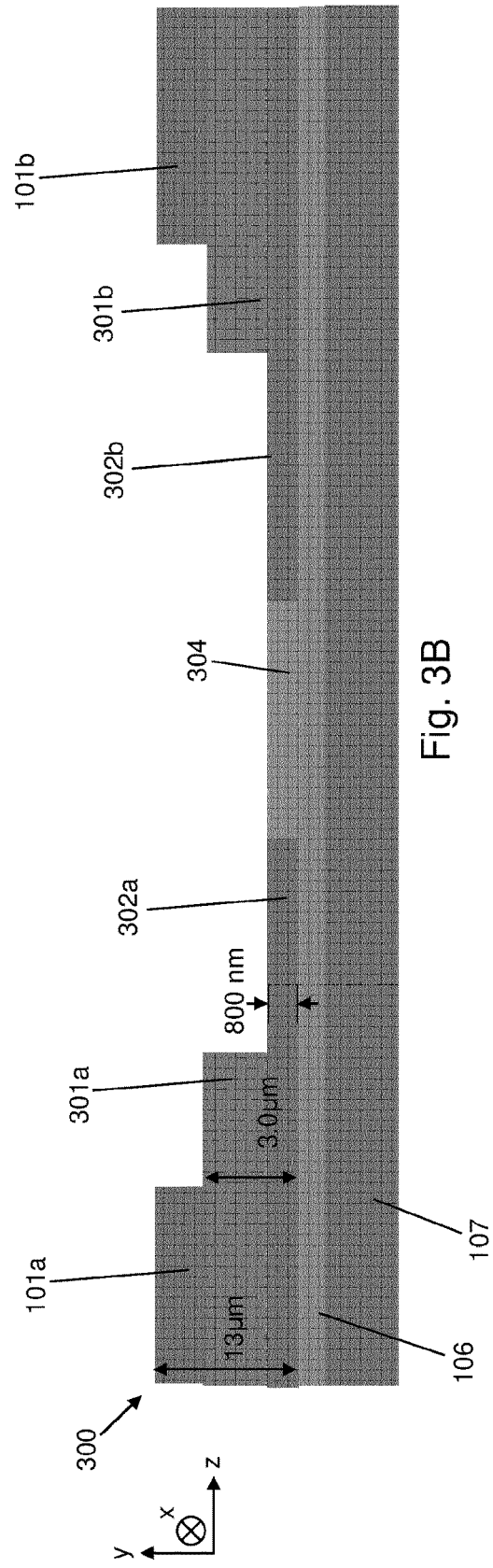
Fig. 3A
Fig. 3B

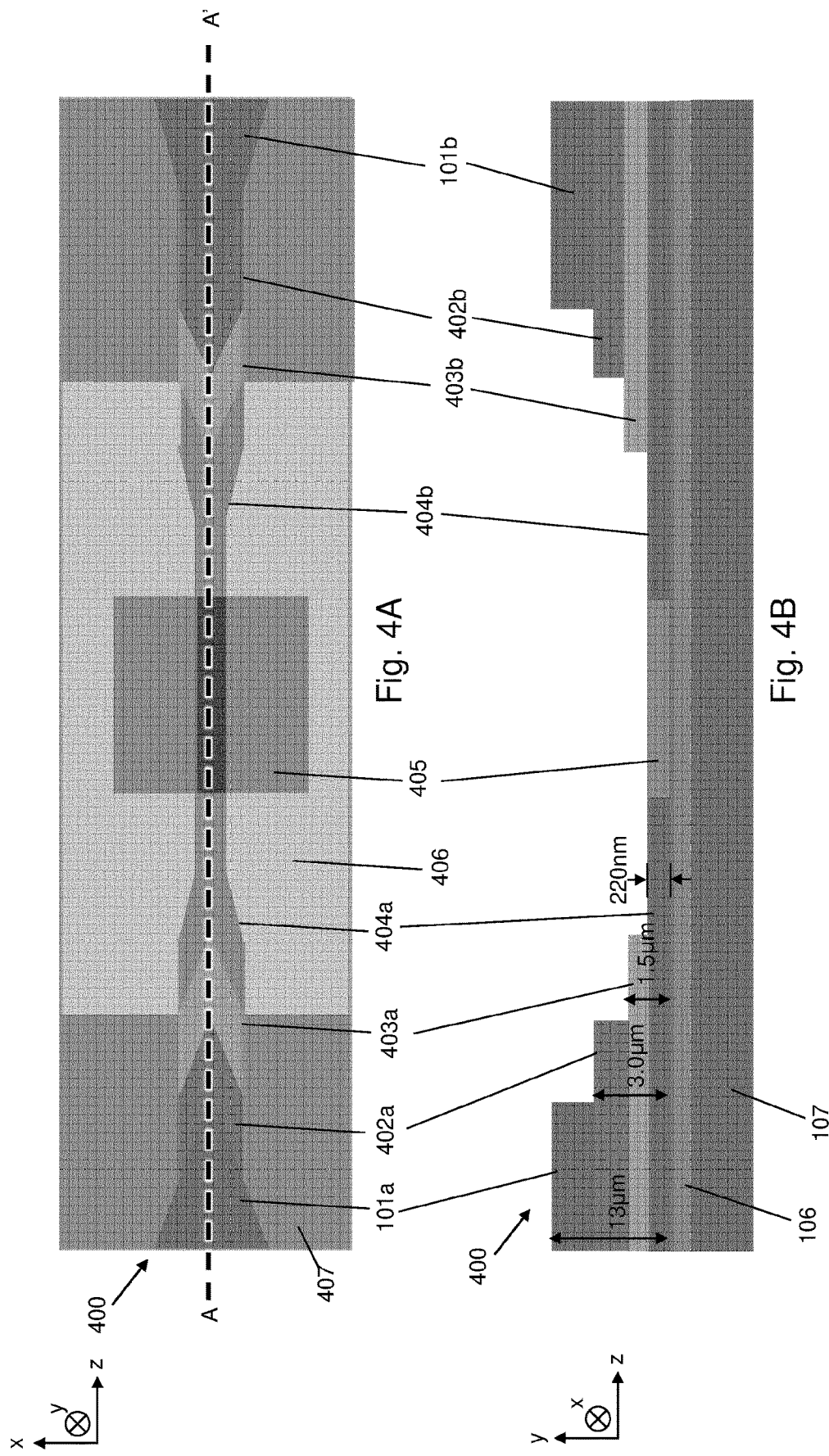

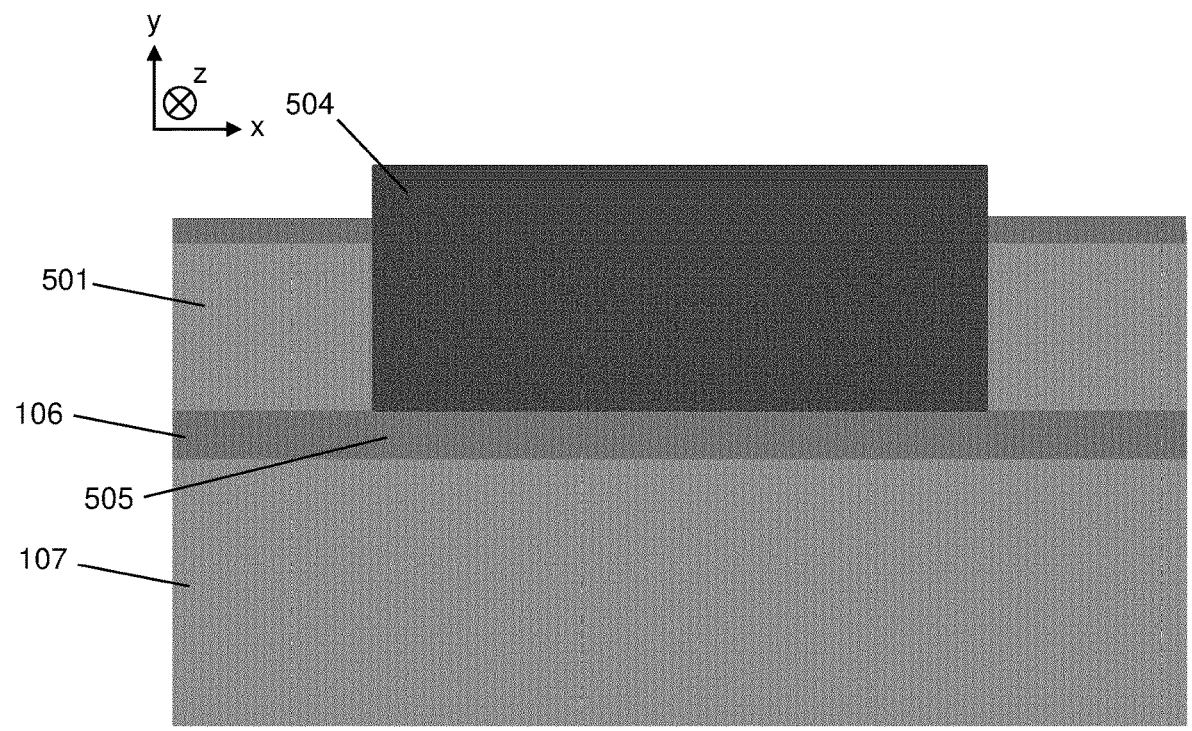
Fig. 5(iii)

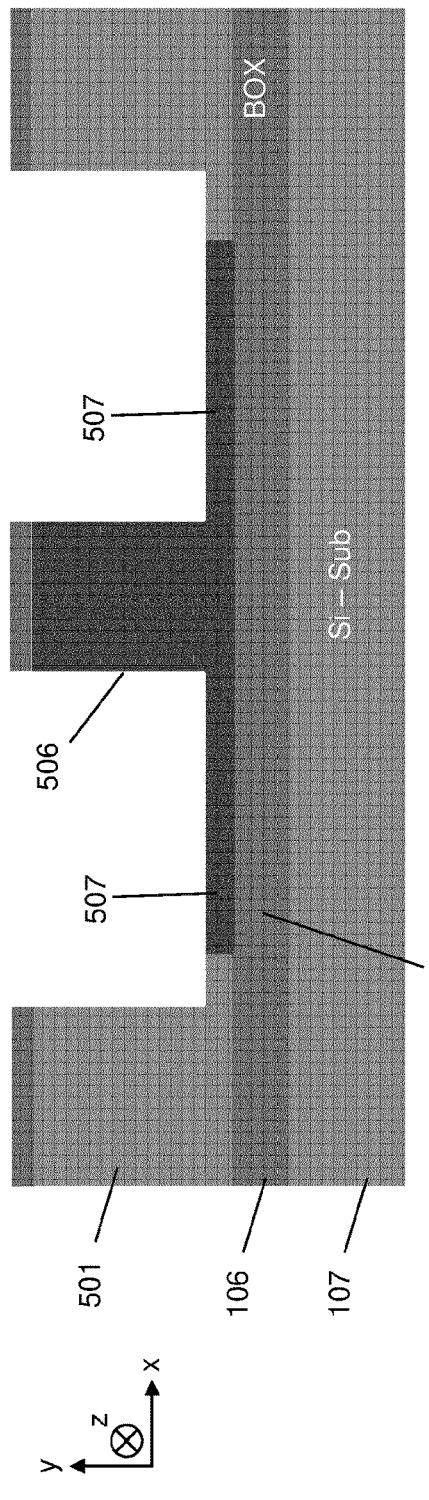
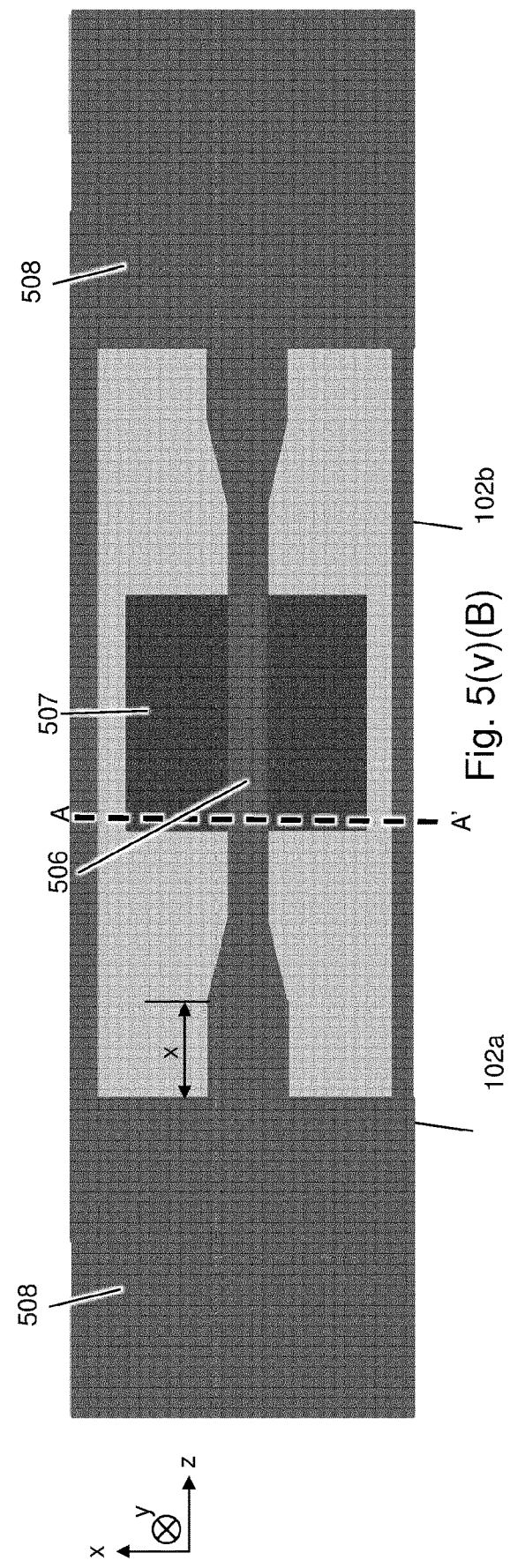
Fig. 5(v)(A)
Fig. 5(v)(B)

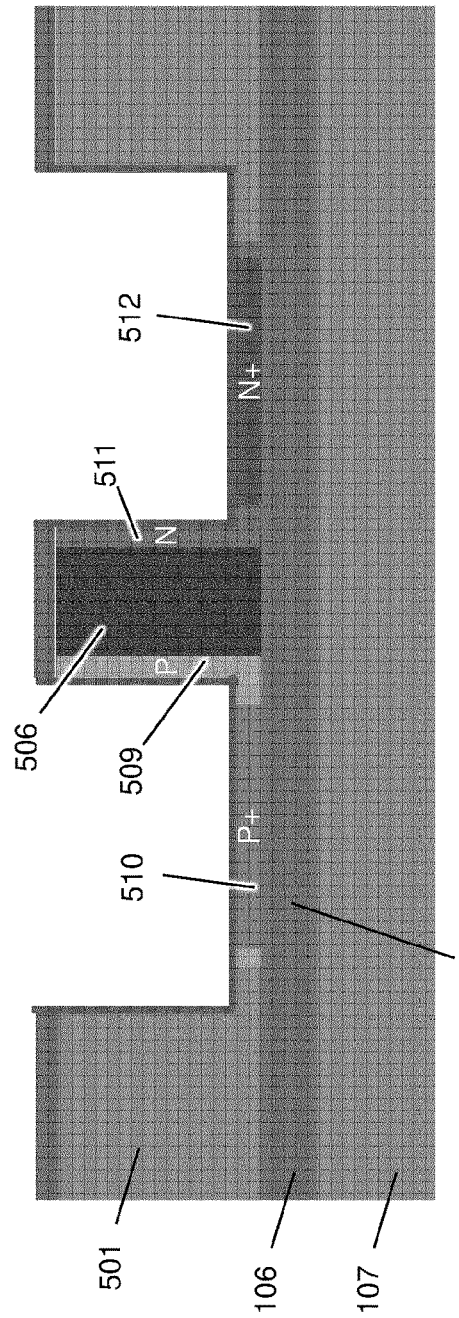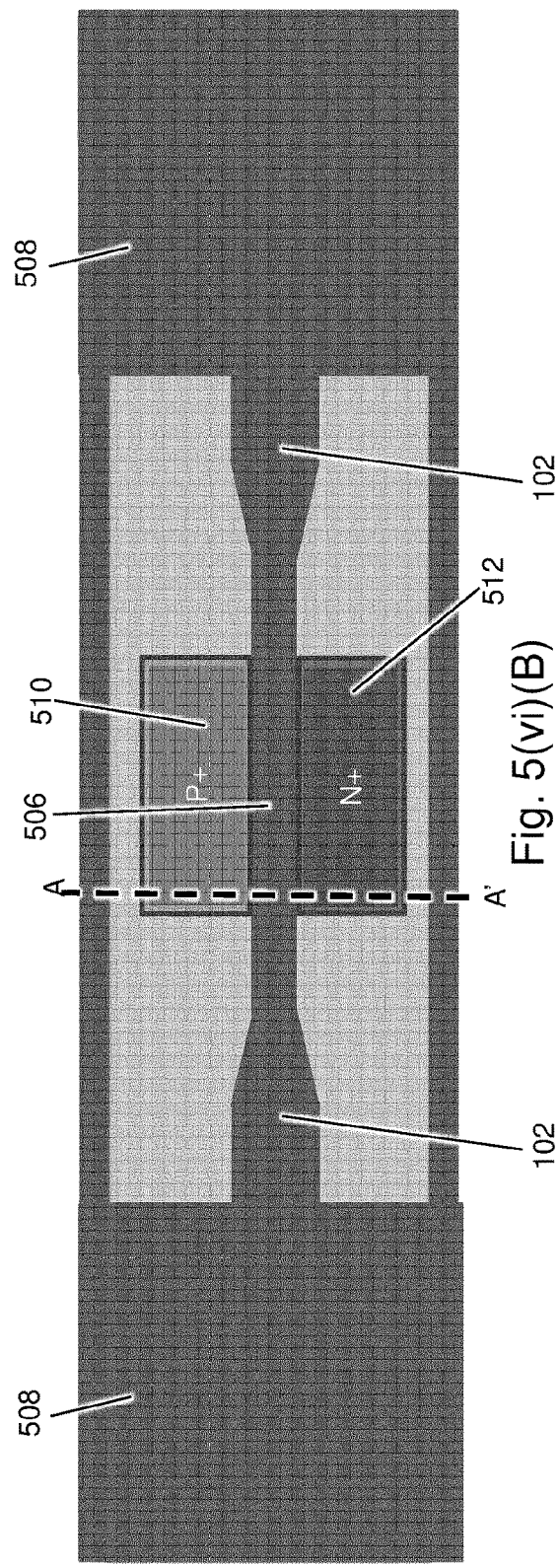
Fig. 5(vi)(A)
Fig. 5(vi)(B)

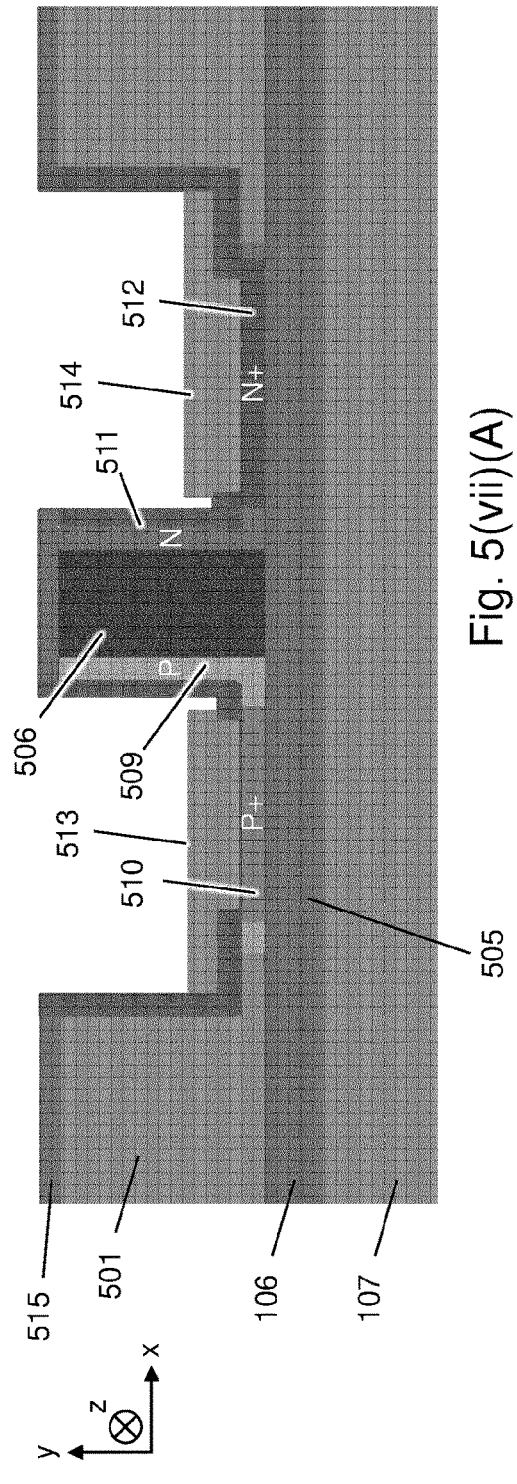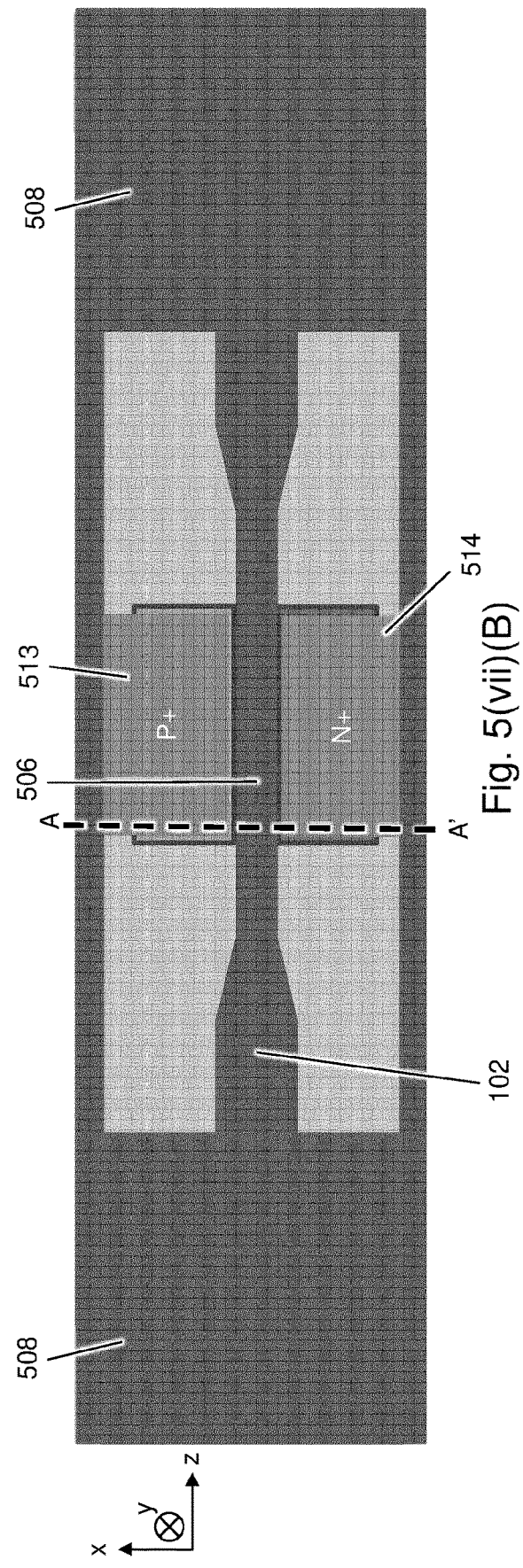
Fig. 5(vii)(A)
Fig. 5(vii)(B)

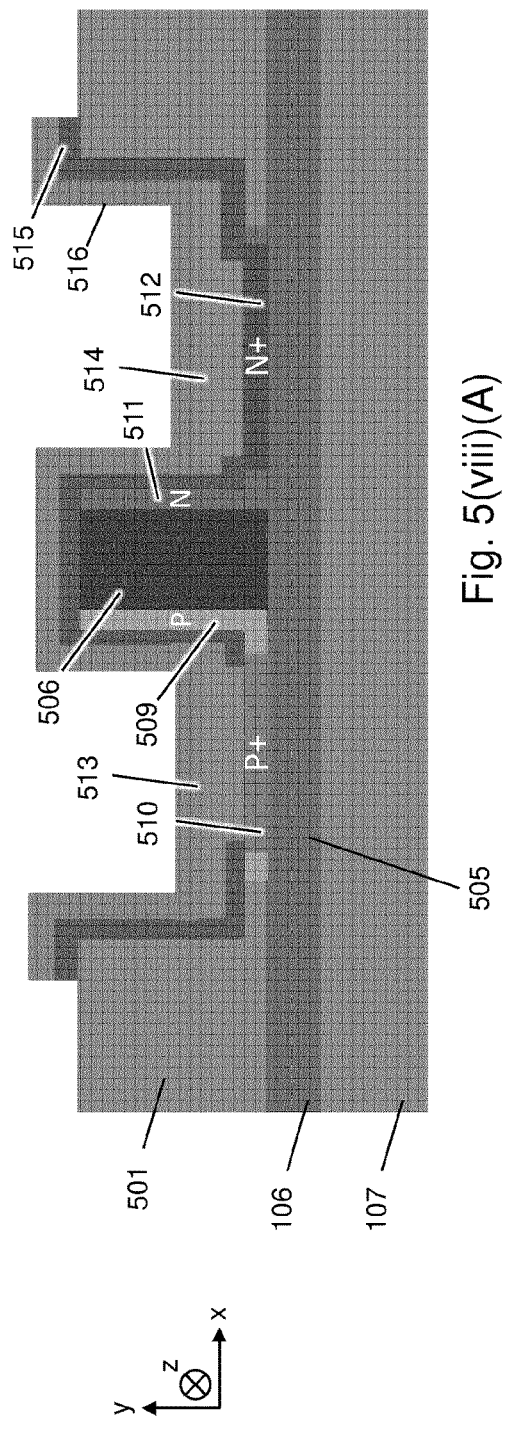
Fig. 5(viii)(A)
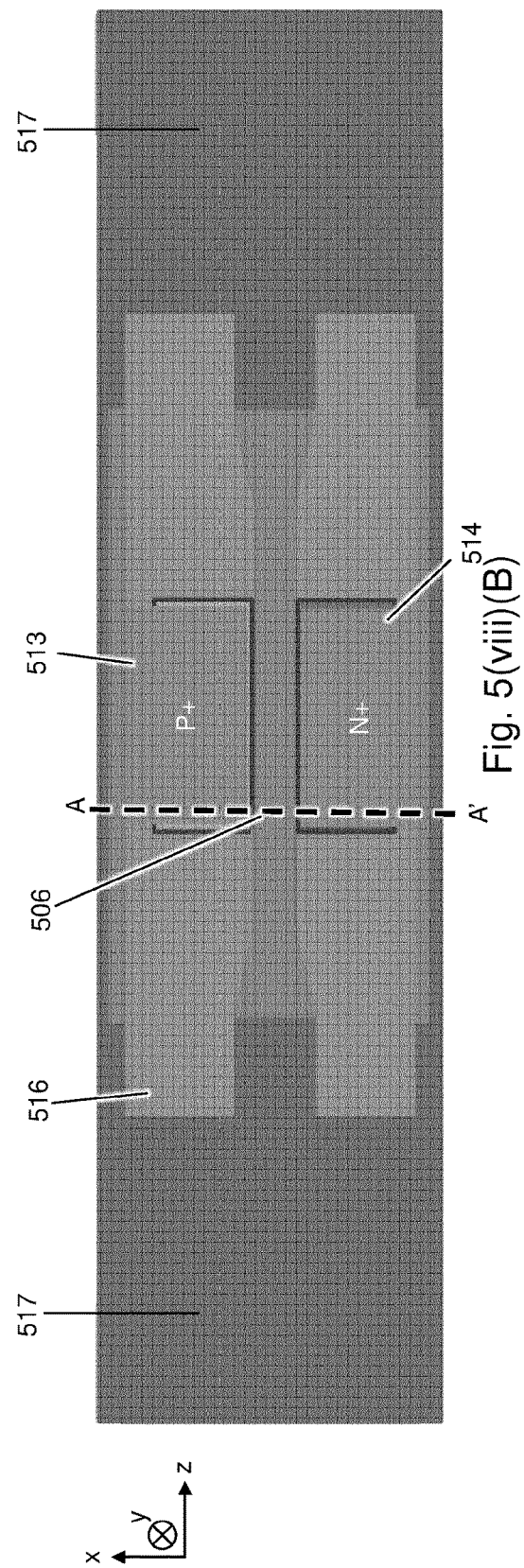
Fig. 5(viii)(B)

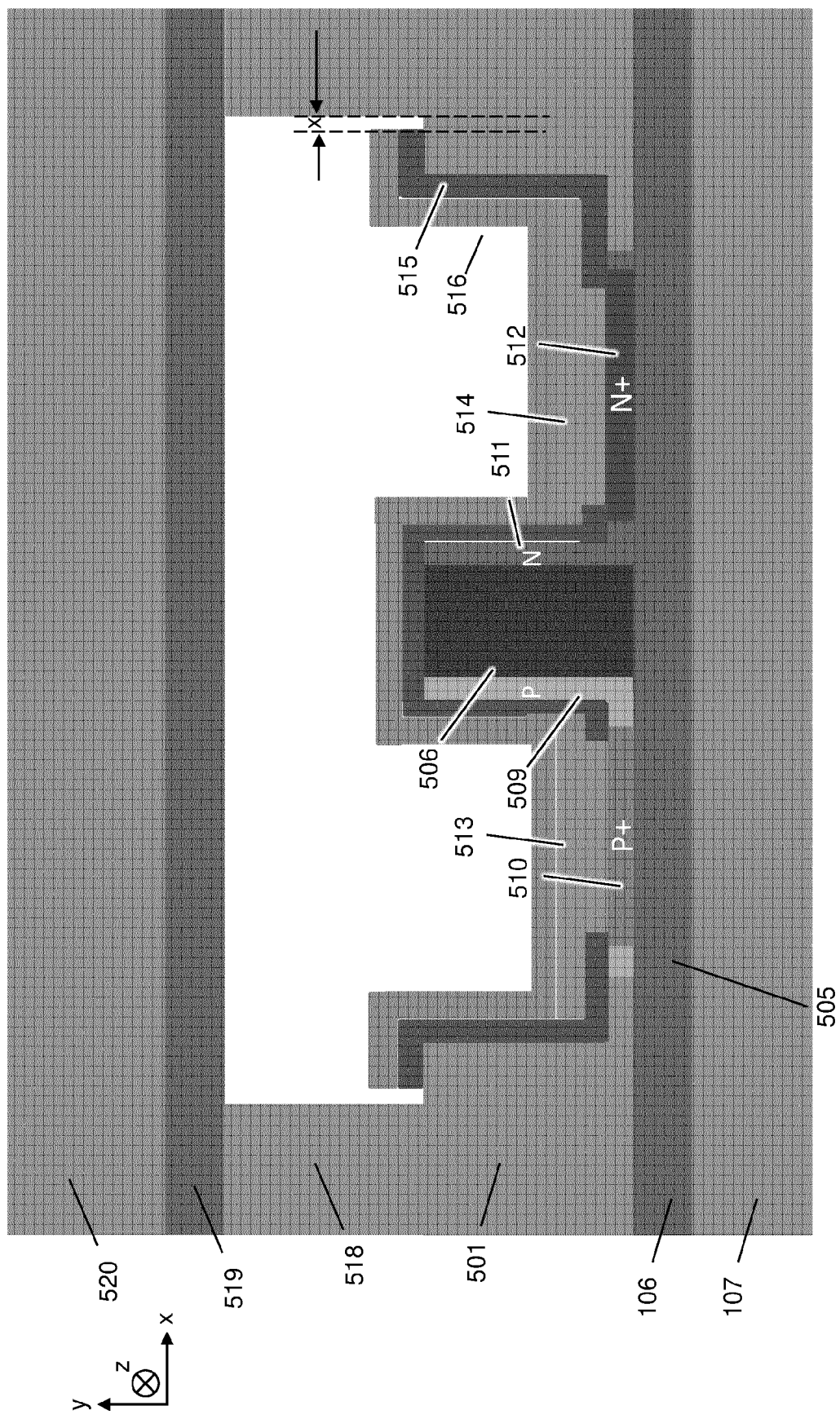

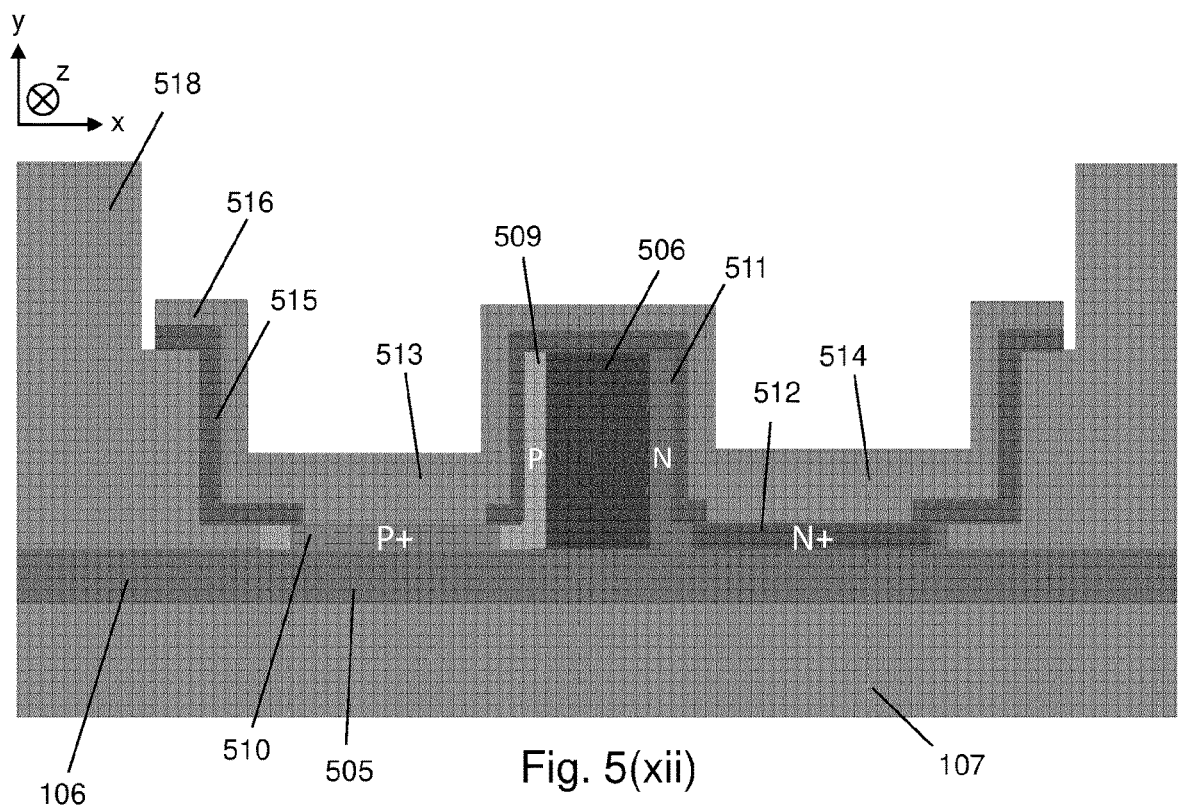
Fig. 5(xii)
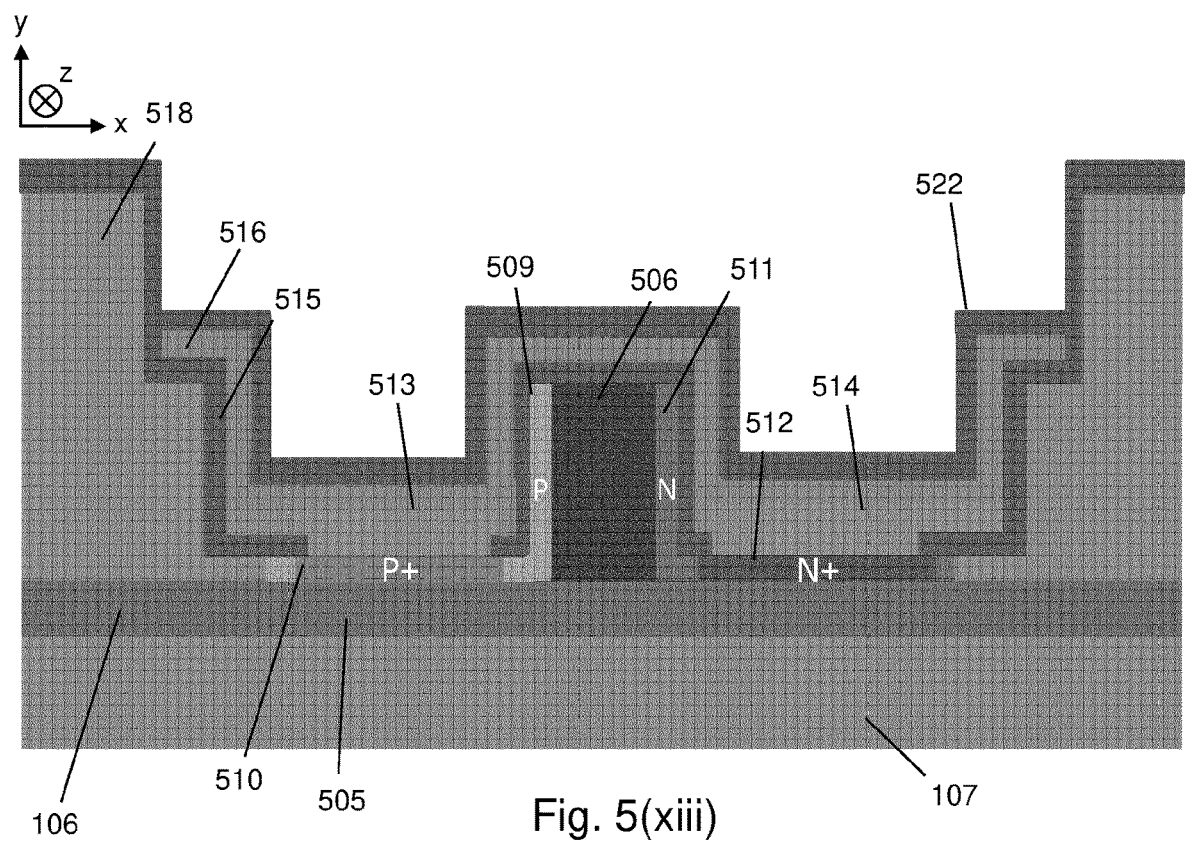
Fig. 5(xiii)

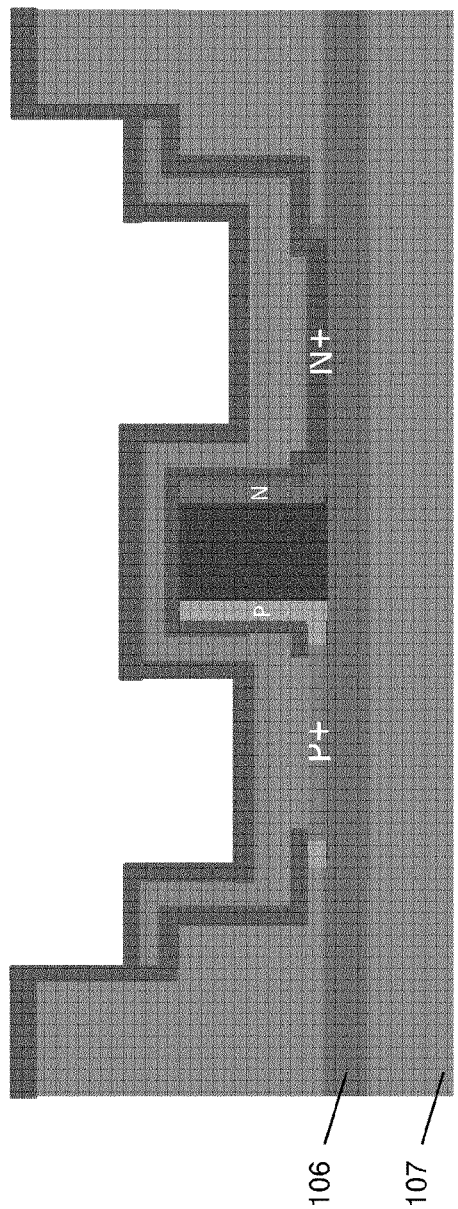
Fig. 5(xiv)(A)
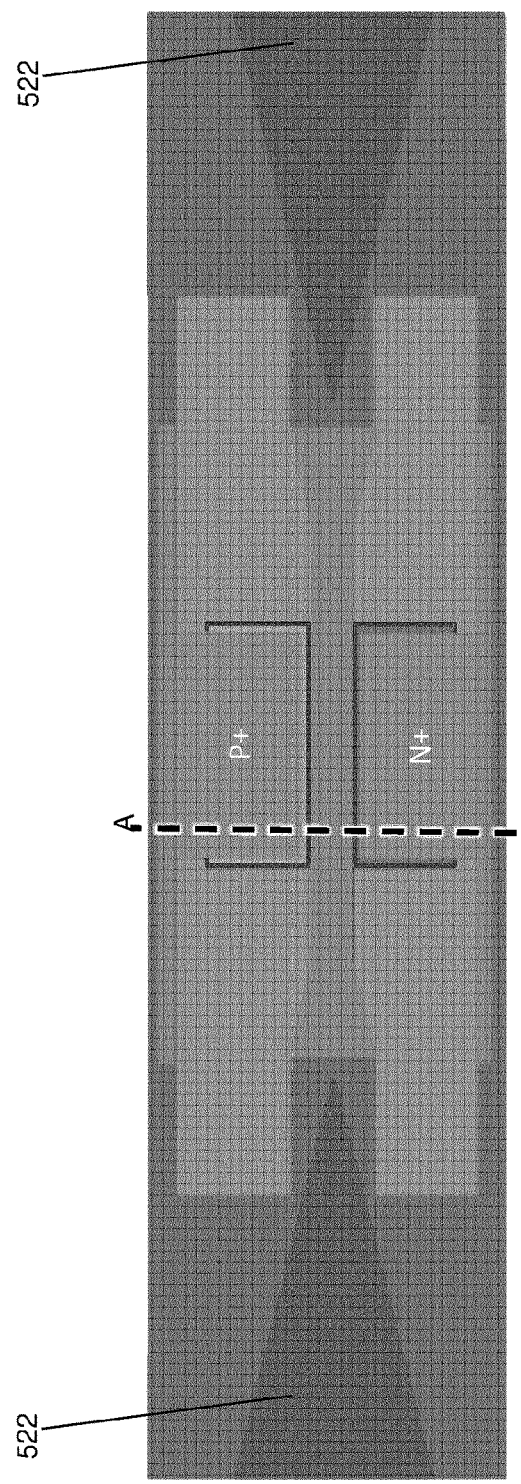
Fig. 5(xiv)(B)

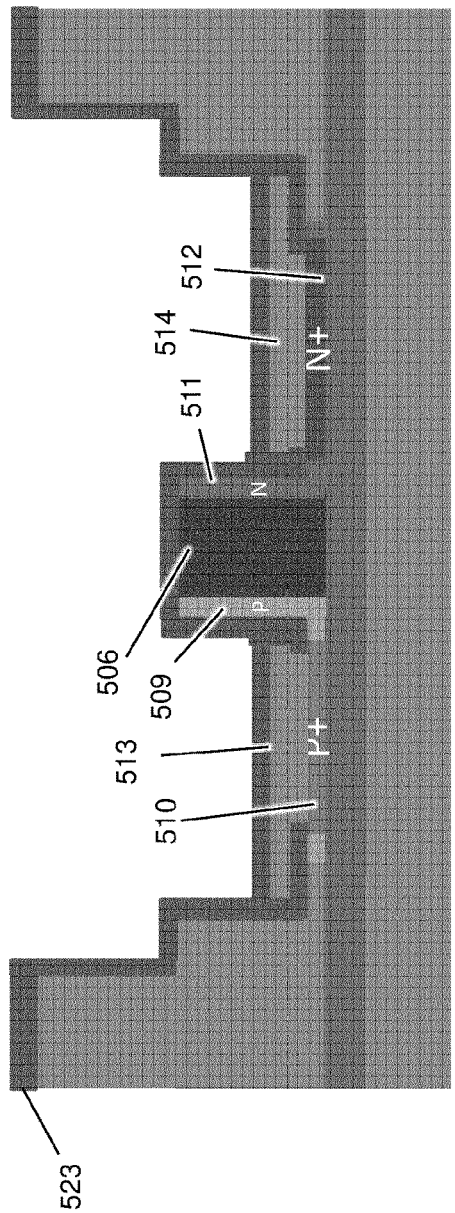
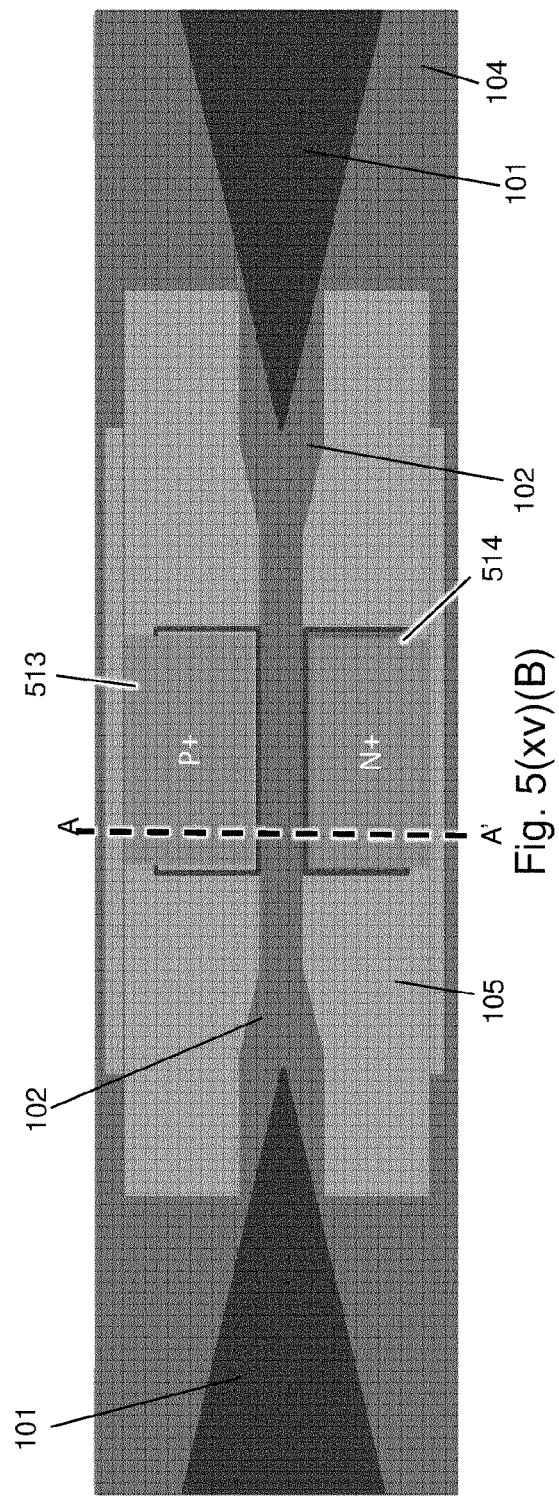
Fig. 5(xv)(A)
Fig. 5(xv)(B)

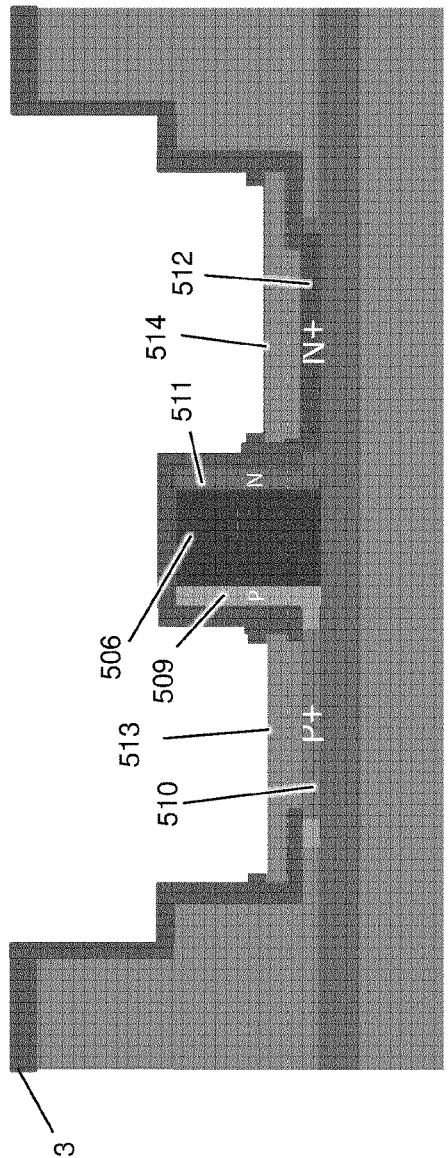
Fig. 5(xvi)(A)
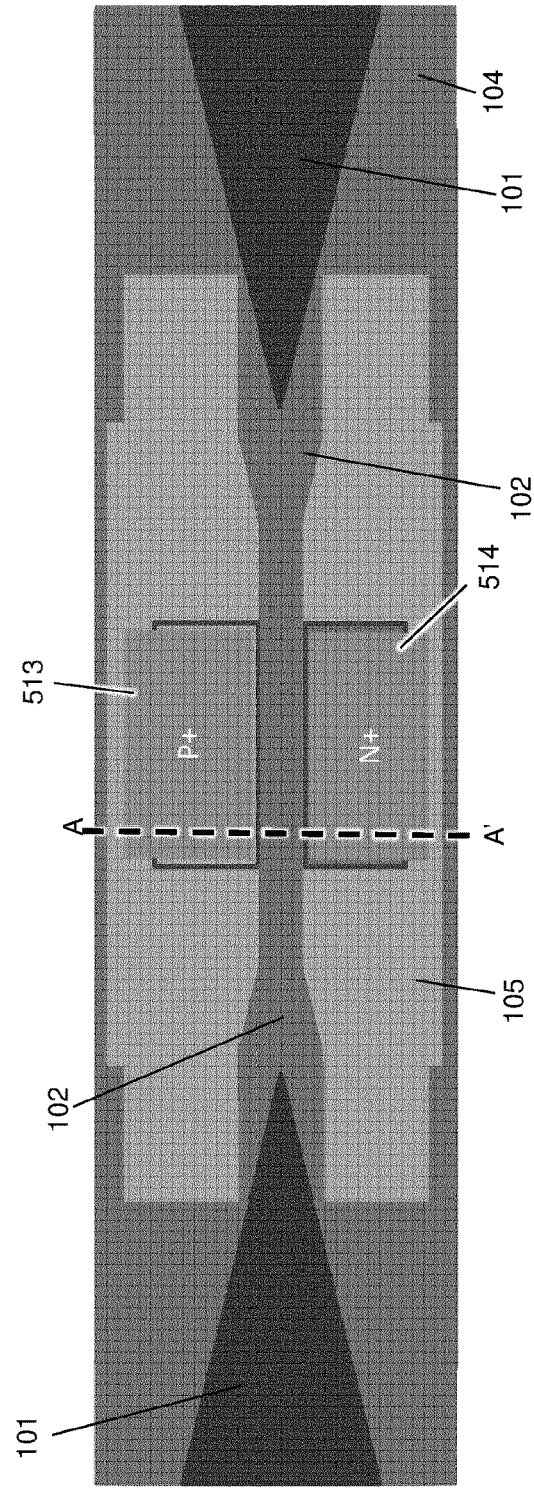
Fig. 5(xvi)(B)

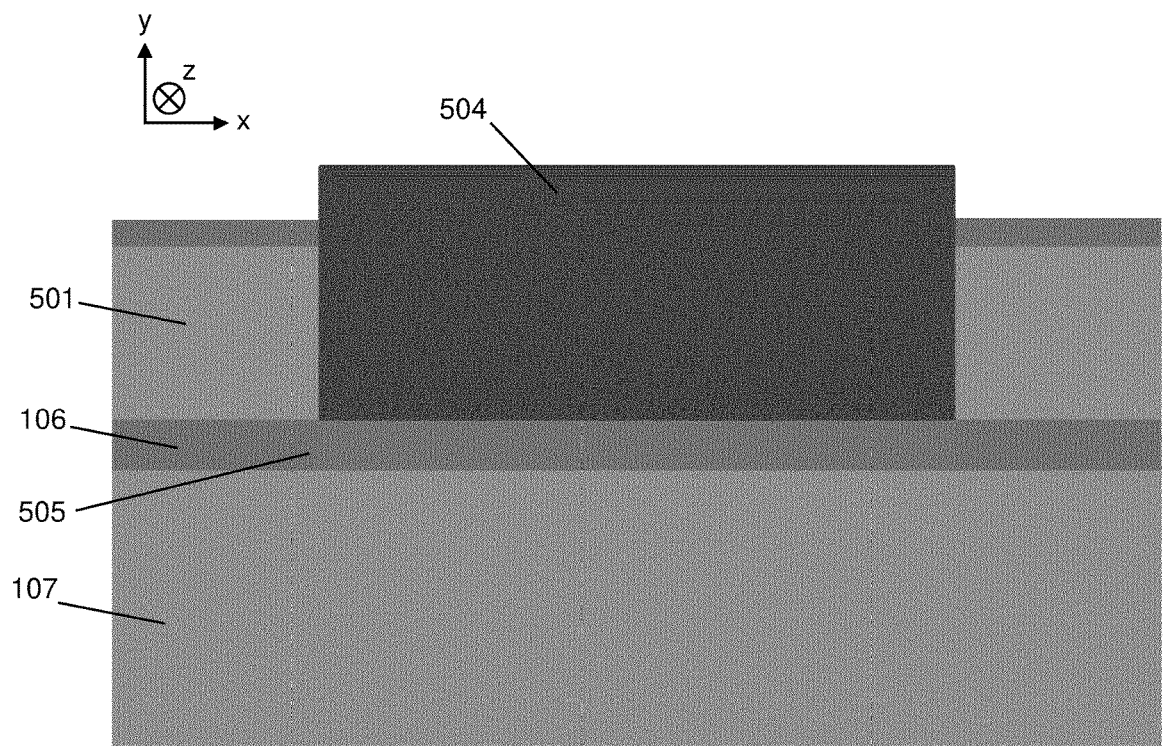
Fig. 6(iii)

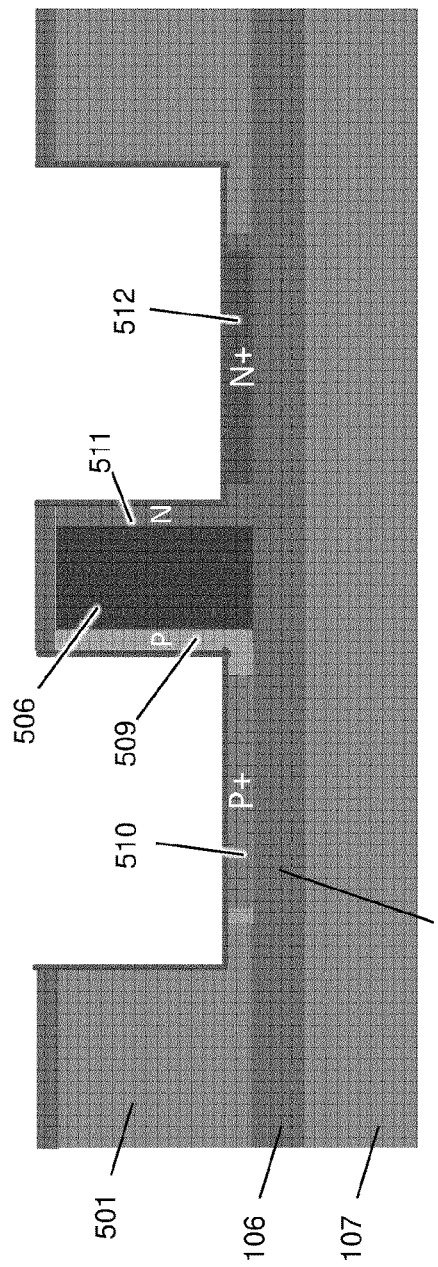
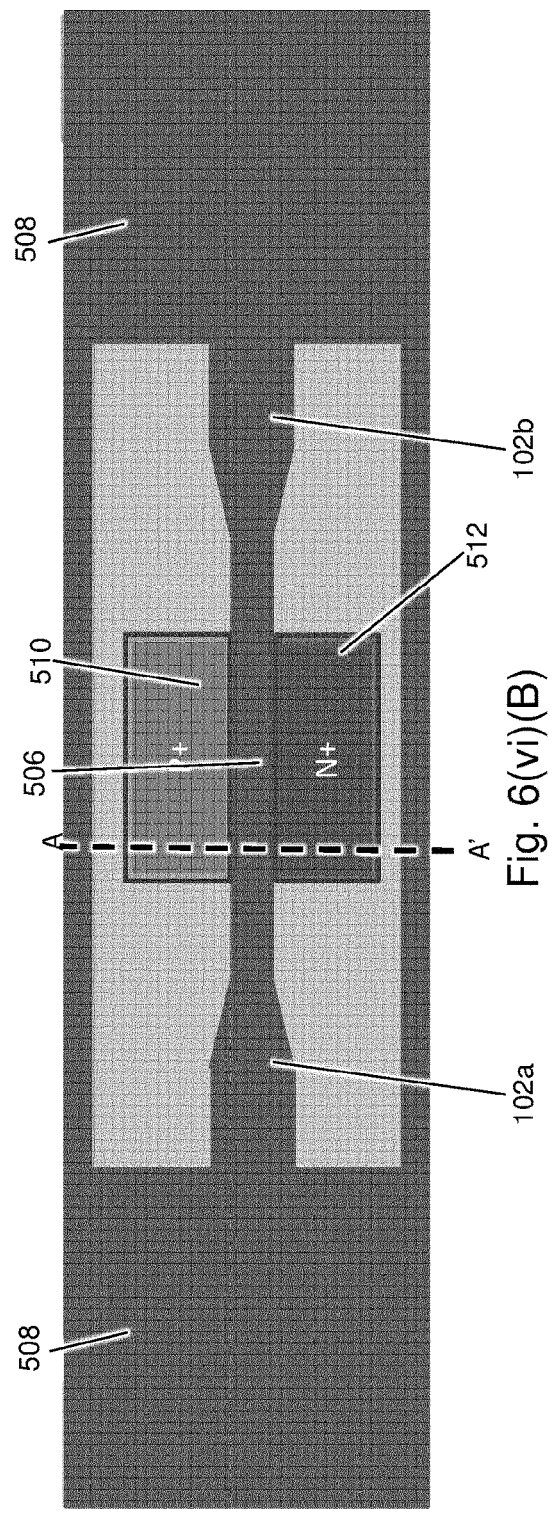
Fig. 6(vi)(A)
Fig. 6(vi)(B)

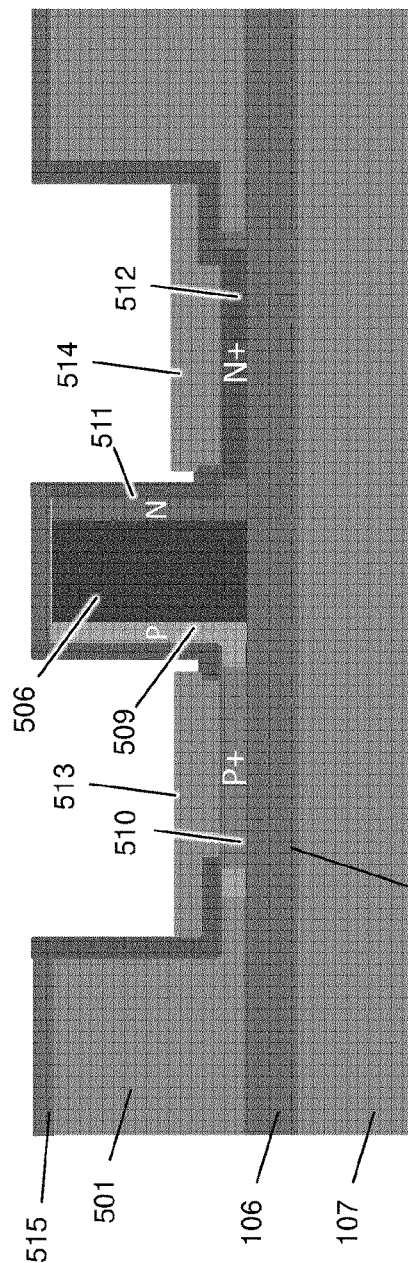
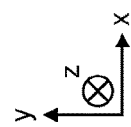
Fig. 6(vii)(A)
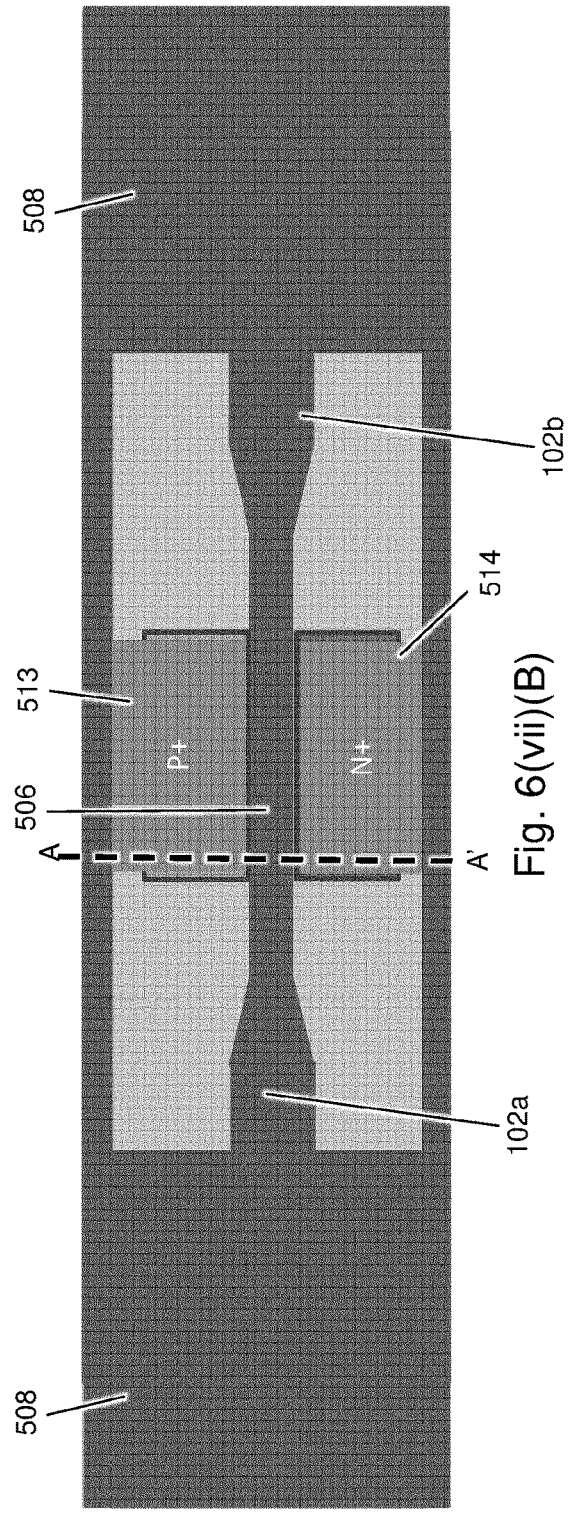
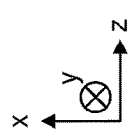
Fig. 6(vii)(B)

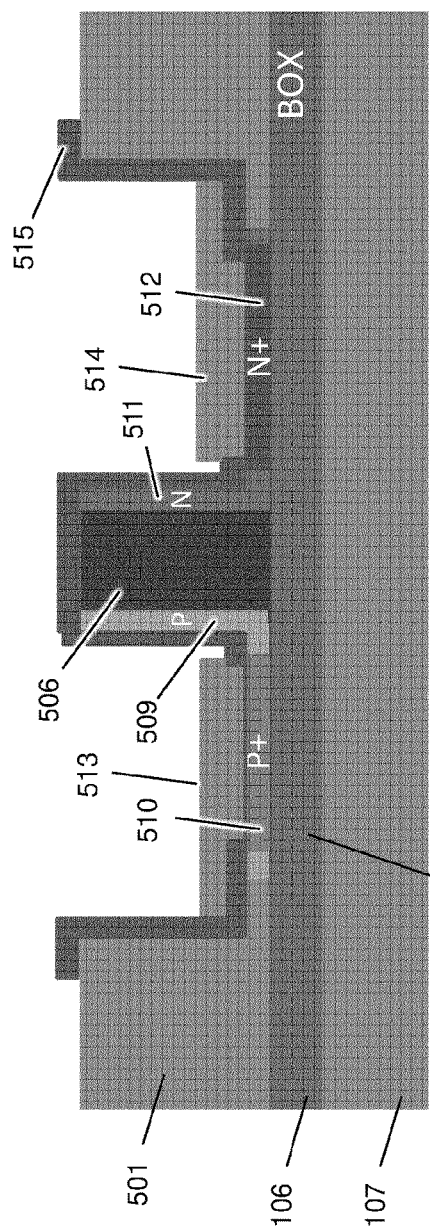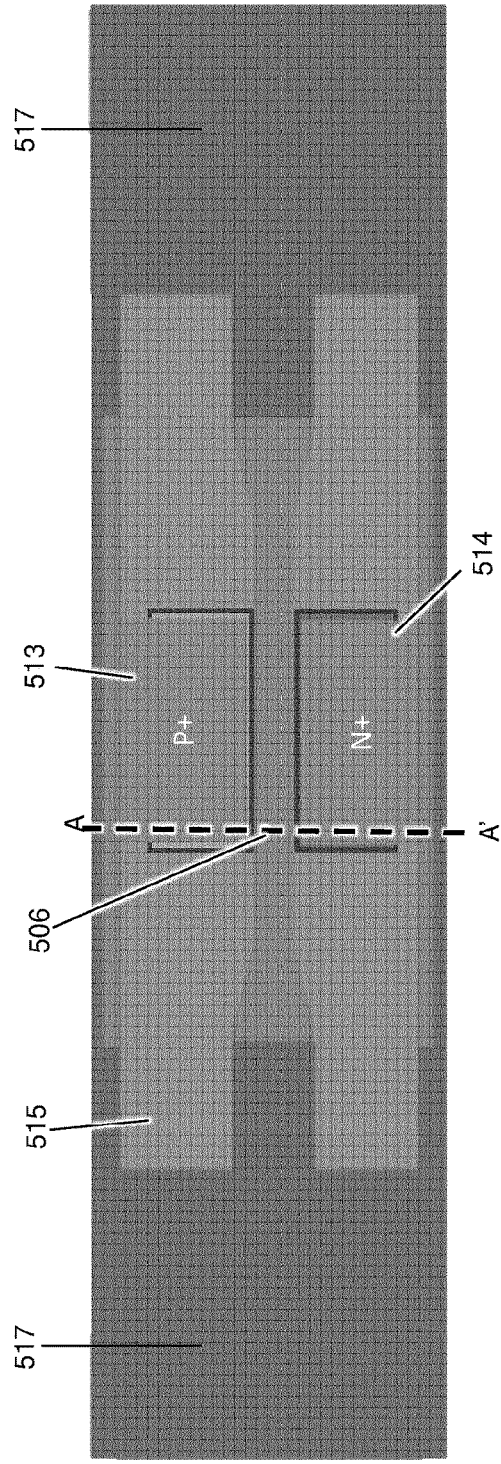
Fig. 6(viii)(A)
Fig. 6(viii)(B)

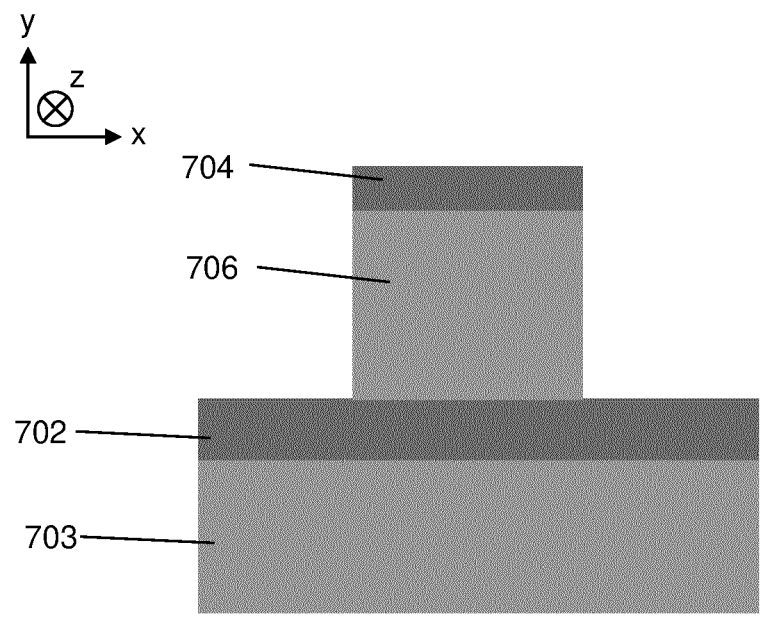
Fig. 7(iii)(A)
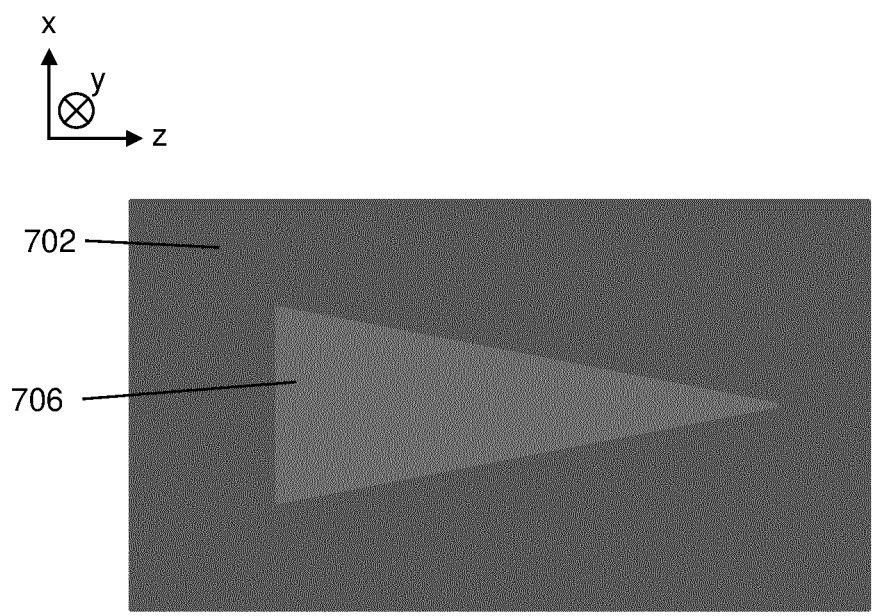
Fig. 7(iii)(B)

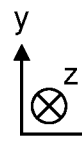
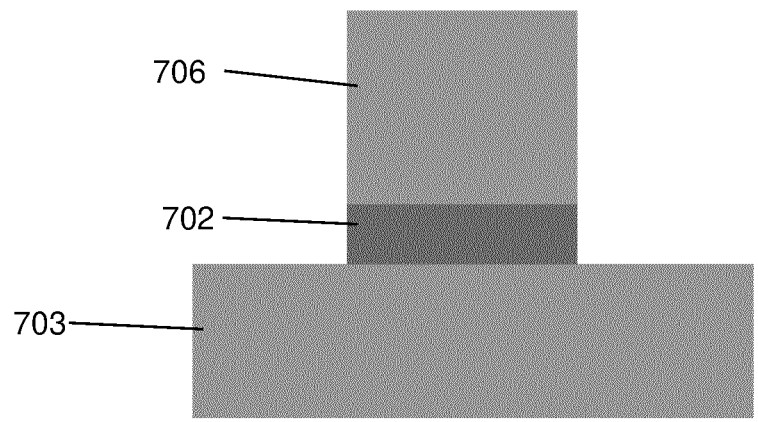
Fig. 7(iv)(A)
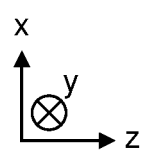
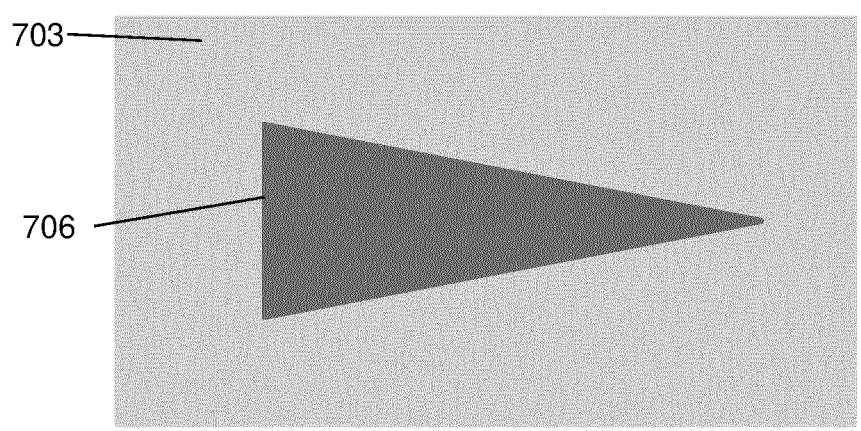
Fig. 7(iv)(B)

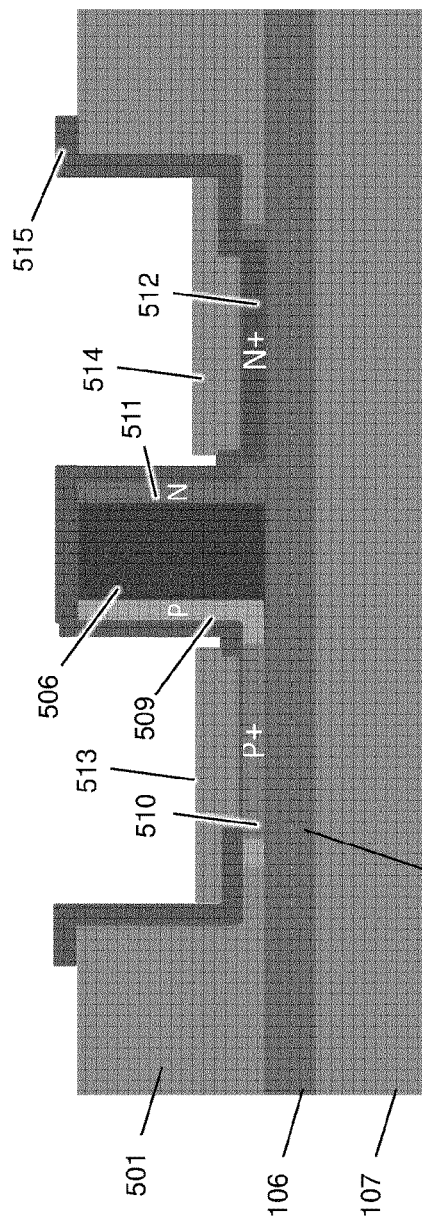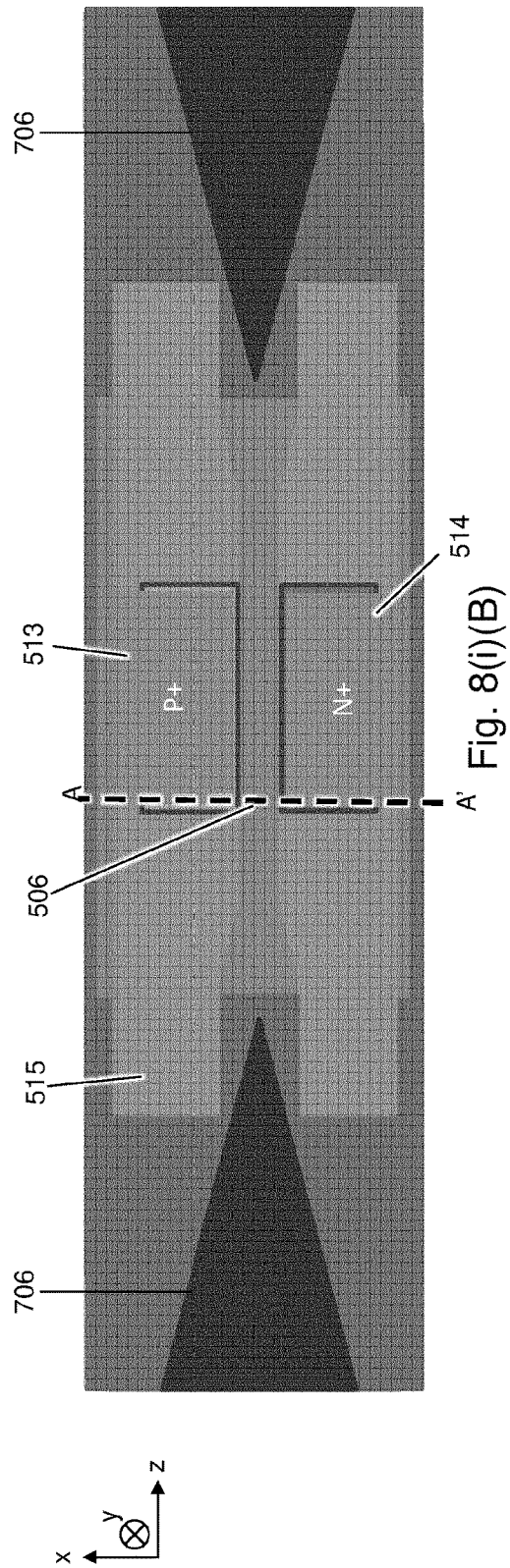
Fig. 8(i)(A)
Fig. 8(i)(B)

OPTOELECTRONIC DEVICE AND METHOD OF MANUFACTURE THEREOF

CROSS-REFERENCE TO RELATED APPLICATION(S)

This application is a national stage entry, under 35 U.S.C. § 371, of International Application Number PCT/EP2019/084274, filed on Dec. 9, 2019, which claims priority to and the benefit of U.S. Provisional Patent Application No. 62/777,632, filed Dec. 10, 2018. The entire contents of all of the applications identified in this paragraph are incorporated herein by reference.

FIELD OF THE INVENTION

The present invention relates to an optoelectronic device and method of manufacture thereof.

BACKGROUND

In optoelectronic devices there can be significant optical loss when a standard single mode fibre, with a typical mode size of 10.6 µm at a wavelength of 1.55 µm, couples to a silicon waveguide which might have a mode size ranging from submicron to 3 µm (depending on the silicon-on-insulator, SOI, platform used) due to mode mismatching.

To minimise the coupling loss, 13 µm×13 µm silicon waveguides have been used since the mode size matches that of the standard single mode fibre. Mode converters, or tapers, are used to adiabatically transition the mode from the 13 µm×13 µm waveguide to a smaller silicon waveguide in the SOI platform. However, current solutions, such as double SOI mode converters, have complicated fabrication processes which result in high optical loss and a lower device yield.

There is a desire then, for a fabrication process to provide mode converters with a lower optical loss and with a higher device yield.

SUMMARY

Accordingly, in a first aspect, embodiments of the present invention provide a method of manufacturing an optoelectronic device including a mode converter, the method having the steps of:
on a first silicon-on-insulator (SOI) wafer, manufacturing the optoelectronic device; and either:
on a second SOI wafer, manufacturing a mode converter, and
bonding the mode converter to the first SOI wafer;
or
bonding a second SOI wafer to the first SOI wafer to form a combined wafer;
and etching a mode converter into the combined wafer.

Such a method results in simpler manufacturing process, and therefore to a higher manufacturing yield. Moreover, devices so fabricated have a lower optical loss.

Optional features of embodiments of the invention will now be set out. These are applicable singly or in any combination with any aspect of the invention.

Multiple mode converters may be manufactured on the second SOI wafer or the combined wafer.

In a second aspect, embodiments of the present invention provide a method of manufacturing an optoelectronic device including a mode converter, the method having the steps of:

on a first SOI wafer, manufacturing the optoelectronic device;
on a second SOI wafer, manufacturing the mode converter; and
bonding the mode converter to the first SOI wafer.

Manufacturing the mode converter on the second SOI wafer may include the steps of:
disposing a first photoresist over a portion of a device layer of the second SOI wafer; and
etching the exposed regions of the device layer to form the mode converter.

The mode converter may be formed as a tapered waveguide, which decreases in width along a direction parallel to the guiding direction of the waveguide.

Manufacturing the mode converter on the second SOI wafer may include a step of preparing the second SOI wafer for a micro-transfer printing process. Preparing the second SOI wafer for the micro-transfer printing process may include a step of: patterning a tether onto the mode converter; and removing an insulator layer between the mode converter and a silicon substrate of the second SOI wafer, thereby leaving the mode converter suspended via the tether.

The step of manufacturing the mode converter on the second SOI wafer may be performed before, or simultaneously with, the step of manufacturing the optoelectronic device on the first SOI wafer.

Bonding the mode converter to the first wafer may be performed via a micro-transfer printing process. The micro-transfer printing process may include a plasma treatment step and an annealing step, to bond the mode converter to a bonding region of the first wafer.

Manufacturing the optoelectronic device may include the step of: manufacturing an input waveguide and/or an output waveguide on the first SOI wafer.

The optoelectronic device may be an electro-optic modulator, a laser, or a detector, and manufacturing the optoelectronic device may include the steps of: etching a device cavity into a device layer of the first SOI wafer; and growing an optically active region in the device cavity. Manufacturing the optoelectronic device may further comprise the step of: etching the grown optically active region in the device cavity to form an optically active waveguide. The optoelectronic device may be an electro-optic modulator or a detector, and manufacturing the optoelectronic device may further include: doping two or more regions of the optically active waveguide; and disposing an electrode in electrical contact with a respective doped region of the optically active waveguide. The optoelectronic device may be referred to as a photonic integrated circuit (PIC).

Manufacturing the optoelectronic device further includes a step, performed before bonding the second wafer to the first wafer, of: disposing a cover layer over the optoelectronic device, leaving one or more bonding regions, for bonding the first wafer to the second wafer, exposed.

The method may further include a step of manufacturing a further mode converter on the second SOI wafer or on another SOI wafer, and bonding said further mode converter to the first SOI wafer.

In a third aspect, embodiments of the present invention provide a method of manufacturing an optoelectronic device including a mode converter, the method having the steps of:
on a first SOI wafer, manufacturing an optoelectronic device;
bonding a second SOI wafer to the first SOI wafer to form a combined wafer; and
etching a mode converter into the combined wafer.

Manufacturing the optoelectronic device may include a step of: manufacturing an input waveguide and/or an output waveguide on the first SOI wafer.

The optoelectronic device may be: an electro-optic modulator, a laser, a detector, an arrayed waveguide grating, an echelle grating, a Mach-Zehnder interferometer, a ring resonator, or any combination thereof.

The optoelectronic device may be an electro-optic modulator, a laser, or a detector, and manufacturing the optoelectronic device may include the steps of: etching a device cavity into a device layer of the first SOI wafer; and growing an optically active region in the device cavity. Manufacturing the optoelectronic device may further include the step of: etching the grown optically active region in the device cavity to form an optically active waveguide. The optoelectronic device may be an electro-optic modulator, or a detector, and manufacturing the optoelectronic device may include the steps of: doping two or more regions of the optically active waveguide; and disposing an electrode in electrical contact with a respective doped region of the optically active waveguide.

Manufacturing the optoelectronic device may include a step, performed before bonding the second wafer to the first wafer, of: disposing a cover layer over the optoelectronic device, leaving one or more bonding regions, for bonding the first wafer to the second wafer, exposed.

The method may include, prior to bonding the second SOI wafer to the first SOI wafer, a step of: etching a second cavity into a device layer of the second SOI wafer. Bonding the second SOI wafer to the first SOI wafer may include: inverting the second SOI wafer, and disposing it on an upper surface of the first SOI wafer.

In a further step, a silicon substrate of the second SOI wafer may be removed after the second SOI wafer is bonded to the first SOI wafer.

In a further step, a buried oxide layer of the second SOI wafer may be removed after the second SOI wafer is bonded to the first SOI wafer.

Bonding the second SOI wafer to the first SOI wafer may be performed via a wafer bonding process. The wafer bonding process may be a plasma assisted wafer bonding process. The wafer bonding process may include a step of annealing the first SOI wafer and the second SOI wafer. The anneal may be performed at a temperature of at least 250° C.

The method may include a step of etching multiple mode converters into the combined wafer.

In a fourth aspect, embodiments of the present invention provide an optoelectronic device including a mode converter manufactured according to the method of any of the preceding aspects.

Further aspects of the present invention provide: a computer program comprising code which, when run on a computer, causes the computer to perform the method of the first, second, or third aspect; a computer readable medium storing a computer program comprising code which, when run on a computer, causes the computer to perform the method of the first, second, or third aspect; and a computer system programmed to perform the method of the first, second, or third aspect.

BRIEF DESCRIPTION OF THE DRAWINGS

Embodiments of the invention will now be described by way of example with reference to the accompanying drawings in which:

FIGS. 1A and 1B show a top-down and cross-sectional view of an optoelectronic device including a mode converter;

FIGS. 2A and 2B show a top-down and cross-sectional view of a variant optoelectronic device including a mode converter;

FIGS. 3A and 3B show a top-down and cross-sectional view of a variant optoelectronic device including a mode converter;

FIGS. 4A and 4B show a top-down and cross-sectional view of a variant optoelectronic device including a mode converter;

DETAILED DESCRIPTION AND FURTHER OPTIONAL FEATURES

Figure 5I:
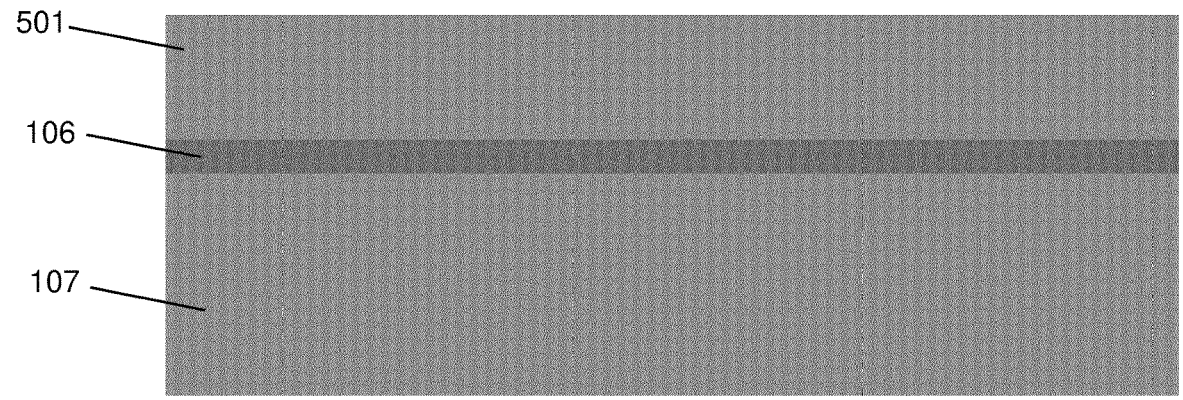
FIGS. 5(i)-5(xvi)(B) show various manufacturing stages of the optoelectronic device including a mode converter of FIGS. 1A and 1B.

Aspects and embodiments of the present invention will now be discussed with reference to the accompanying figures. Further aspects and embodiments will be apparent to those skilled in the art.

FIGS. 1A and 1B show a top-down and cross-sectional view of a photonic device 100 respectively. Broadly, the device 100 includes a 13 µm to 3 µm tapered waveguide 101a which functions as a mode converter for light entering the device (on the left-hand most edge). The light is converted from the optical mode of an input fibre (not shown) to a 3 µm optical mode supported by 3 µm waveguide 102b. The light then enters an optoelectronic device 103, which includes a 3 µm waveguide.

The process is then reversed, and as the light exits the optoelectronic device 103 is it coupled into a 3 µm tapered waveguide 102b which is coupled to a 3 µm to 13 µm tapered waveguide 101b. The light is converted from a 3 µm mode to a 13 µm mode, and is then transmitted onwards via an output fibre (not shown).

FIG. 1B is a cross-section view taken along the line A-A' of FIG. 1A. This view shows in more detail the structure of the photonic device 100. As can be seen, the tapered waveguides 101a and 101b sit atop a 3 µm silicon slab 104. This slab is bordered on a lower side (distal to the tapered waveguides) by a buried oxide layer 106. In this example, the buried oxide layer is formed of silicon dioxide, and functions as a lower cladding layer for the 3 µm silicon waveguides 102a and 102b. On an opposing side of the buried oxide layer 106 to the waveguides is a silicon substrate 107.

As discussed previously, the optoelectronic device 103 may be: an electro-absorption modulator; a laser; a detector; an arrayed waveguide grating; an echelle grating; a Mach-Zehnder interferometer, a ring resonator, or any combination thereof. The optoelectronic device in this example is an electro-absorption modulator. In examples where the component is a laser, there may be only an output fibre, i.e. only waveguides 102b and 101b which connect to an output fibre.

Similarly, in examples where the component is a detector, there may be only an input fibre, i.e. only waveguides 101a and 102a.

FIGS. 2A and 2B show a top-down and cross-sectional view of a variant photonic device 200. Where the device 200 shares features with the device shown in FIGS. 1A and 1B, like features are indicated by like reference numerals. In contrast to the device 100 shown in FIGS. 1A and 1B, the light passing through device 200 undergoes a two-stage mode conversion process.

As before, light enters the device 200 into the left hand side of 13 µm to 3 µm tapered waveguide 101a. The light undergoes a mode conversion, and is provided into a 3 µm to 1 µm tapered waveguide 201a. In a second mode conversion step, the light is then converted to a mode supported by 1 µm waveguide 202a which is optically connected to a 1 µm based optoelectronic device 204. As before, the sequence is then reversed, with the light being coupled from the optoelectronic device 204 to 1 µm waveguide 202b, before being coupled first to the 1 µm to 3 µm tapered waveguide 201b and subsequently to the 3 µm to 13 µm tapered waveguide 101b.

FIGS. 3A and 3B show a top-down and cross-sectional view of a variant photonic device 300. Where the device 300 shares features with the device shown in FIGS. 1A and 1B, like features are indicated by like reference numerals. In contrast to the device 100 shown in FIGS. 1A and 1B, the light passing through device 300 undergoes a two-stage mode conversion process.

As before, light enters the device 300 into the left hand side of 13 µm to 3 µm tapered waveguide 101a. The light undergoes a mode conversion, and is provided into a 3 µm to 800 nm tapered waveguide 301a. In a second mode conversion step, the light is then converted to a mode supported by 800 nm waveguide 302a, which is optically connected to a 800 nm based optoelectronic device 304. As before, the sequence is then reversed, with the light being coupled from the optoelectronic device 304 to 800 nm waveguide 302b, before being coupled first to the 800 nm to 3 µm tapered waveguide 201b and subsequently to the 3 µm to 13 µm tapered waveguide 101b.

FIGS. 4A and 4B show a top-down and cross-sectional view of a variant photonic device 400. Where the device 400 shares features with the device shown in FIGS. 1A and 1B, like features are indicated by like reference numerals. In contrast to the device 400 shown in FIGS. 1A and 1B, the light passing through device 300 undergoes a three-stage mode conversion process.

As before, light enters the device 400 into the left hand side of 13 µm to 3 µm tapered waveguide 101a. The light undergoes a mode conversion, and is provided into a 3 µm to 1.5 µm tapered waveguide 402a. In a second mode conversion step, the light is provided to 1.5 µm to 220 nm tapered waveguide 403a. In a third mode conversion step the light is then converted to a mode supported by 220 nm waveguide 204a, which is optically connected to a 220 nm based optoelectronic device 405. As before, the sequence is then reversed, with the light being coupled from the optoelectronic device 405 to 220 nm waveguide 404b, before being coupled to the 220 nm to 1.5 µm tapered waveguide 403b. Next, the light is coupled to 1.5 µm to 3 µm tapered waveguide 402b, before being provided to 3 µm to 13 µm tapered waveguide 101b.

Figure 5:
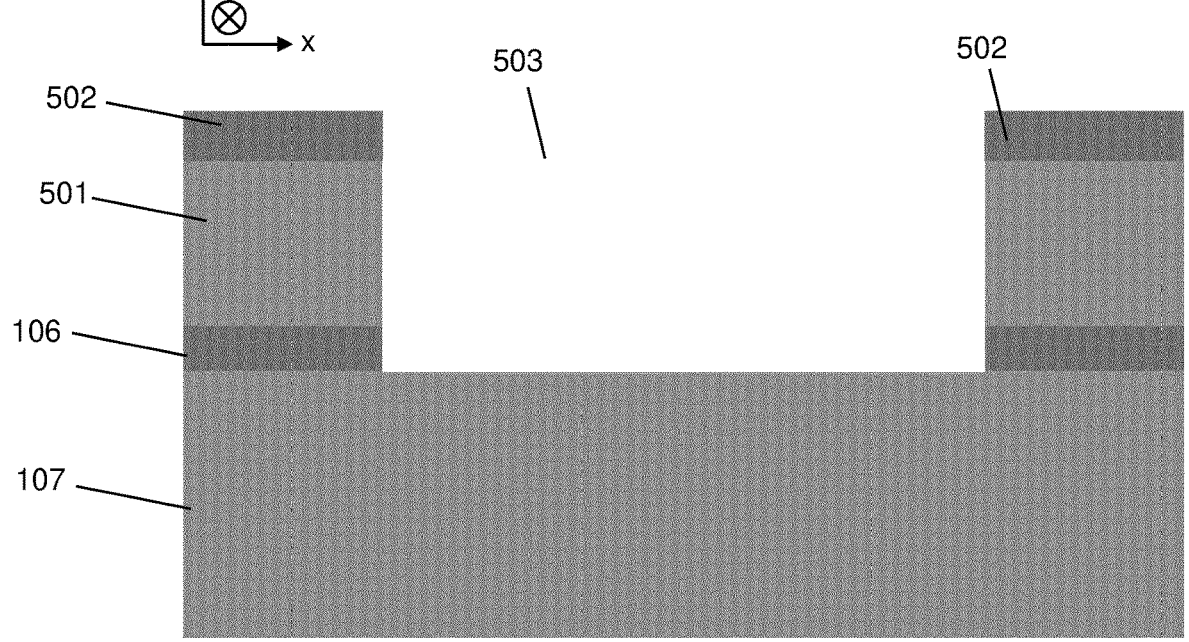
Figure 5:
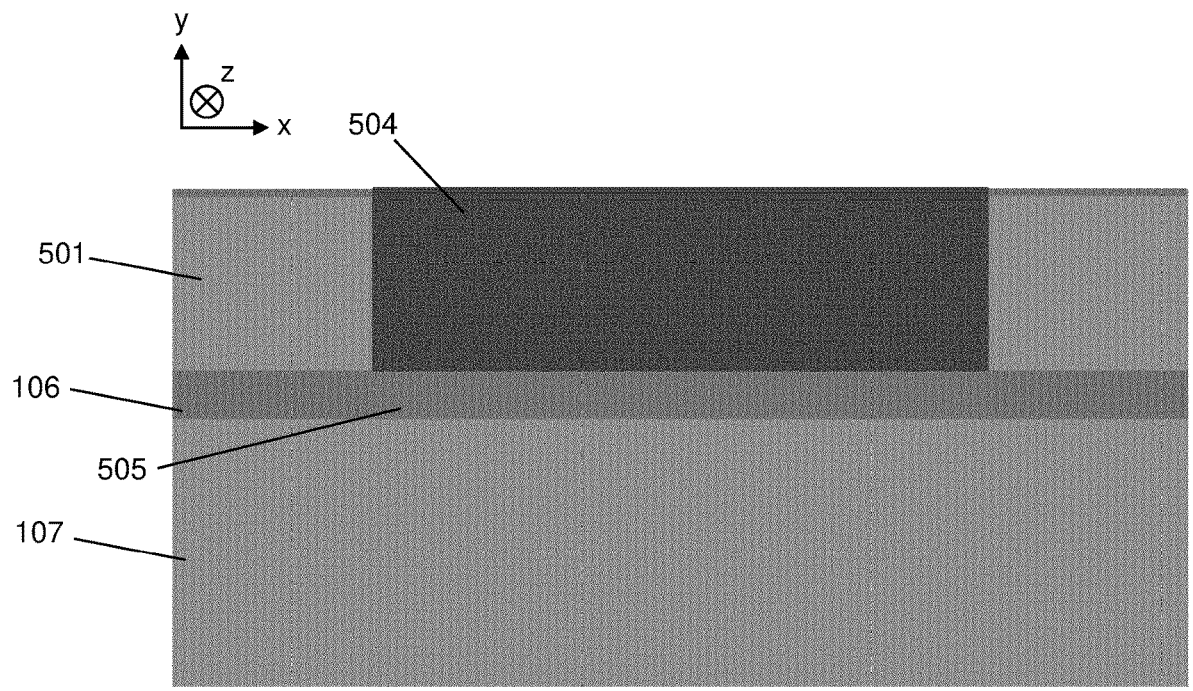
Figure 5:
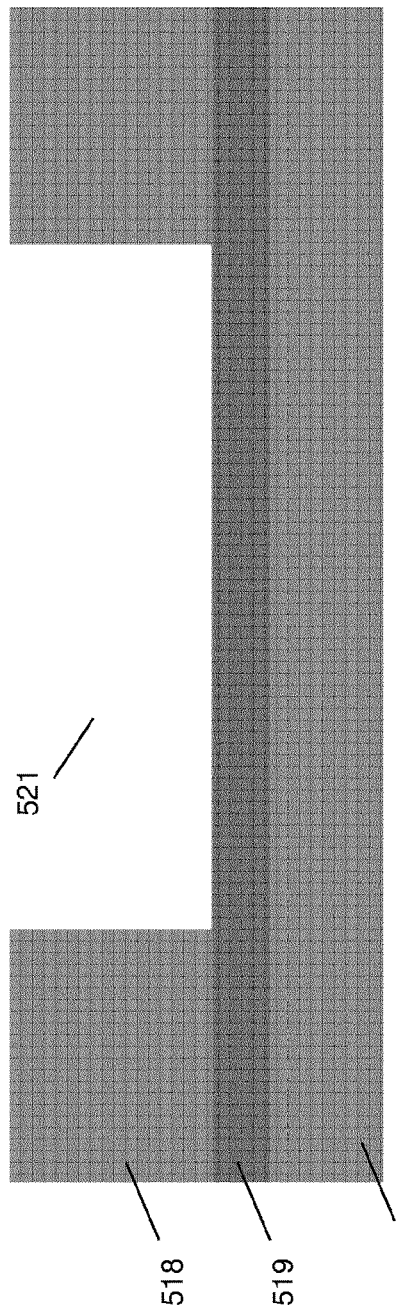
Figure 5:
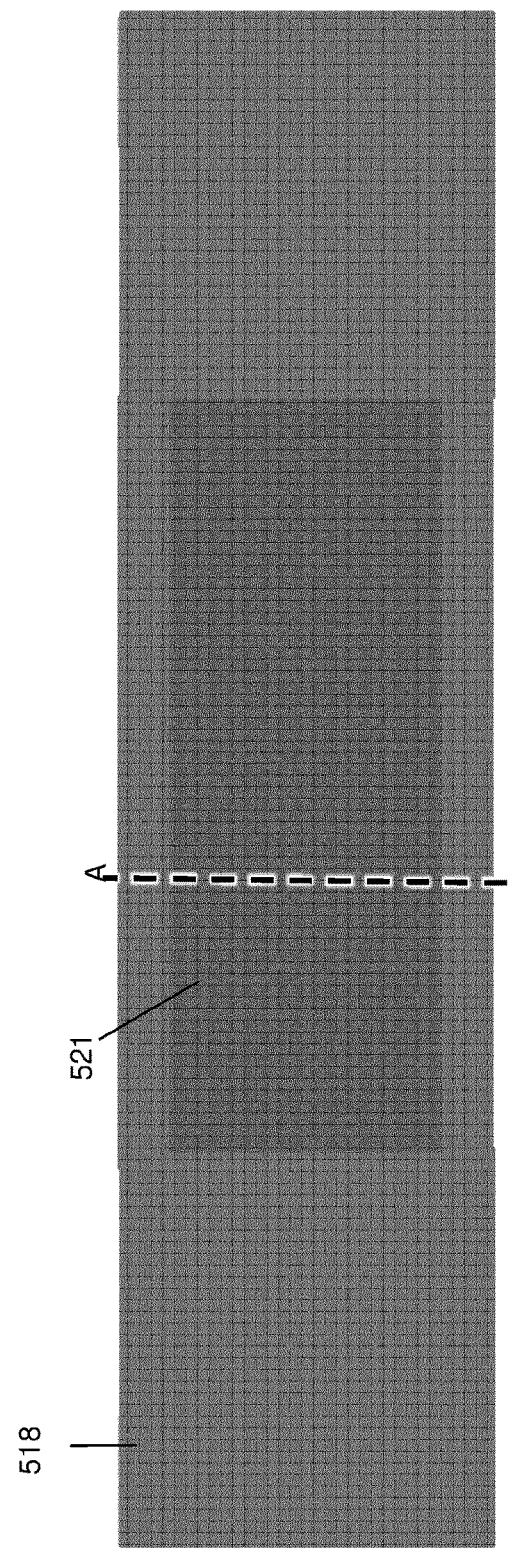
Figure 5:
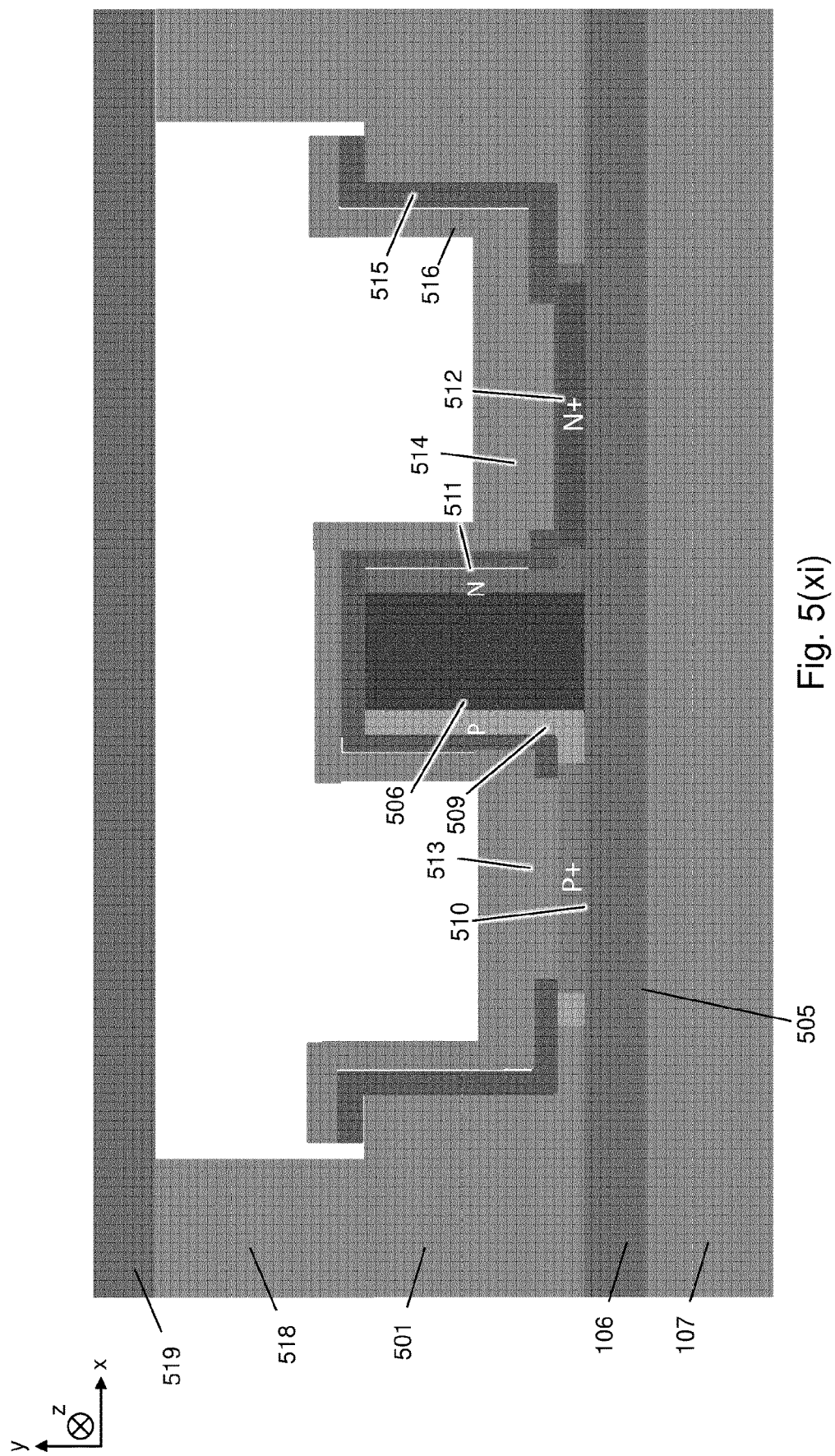

FIGS. 5(i)-5(xvi)(B) show various manufacturing stages of the photonic device of FIGS. 1A and 1B. In a first step, shown in FIG. 5(i), a silicon-on-insulator wafer is provided. The wafer comprises a silicon device layer 501, a buried oxide layer 106, and a silicon substrate 107. In this example, the silicon device layer is around 3 µm tall, as measured from an uppermost surface of the buried oxide layer to an uppermost surface of the silicon device layer.

Next, in a step shown in FIG. 5(ii), a hard mask 502 is provided over a portion of the upper surface of the device layer, and a cavity 503 is etched through the silicon device layer 501 and also through the buried oxide layer 106. This etch may be performed in two-steps, a first using the buried oxide layer as an etch stop, and a second using the silicon substrate as an etch stop. After this etch, a silicon cladding layer 505 is epitaxially grown from the silicon substrate, and a silicon germanium stack 504 is epitaxially grown on top of the silicon cladding layer. This is shown in FIG. 5(iii). The silicon cladding layer has a composition such that it functions as a bottom cladding layer for a waveguide subsequently formed from the silicon germanium stack 504. For example, the silicon cladding layer may have a composition such that the refractive index of the cladding layer is lower than that of the silicon germanium stack.

After the silicon germanium stack 504 is provided, it is planarized relative to surrounding surfaces via a chemical-mechanical planarian process. The result of this is shown in FIG. 5(iv). Next, a portion of the silicon device layer and the silicon germanium stack are etched to provide silicon rib waveguides 102a and 102b either end of, and which couple into, a silicon germanium rib waveguide 506. This is shown in FIGS. 5(v)(A) and 5(v)(B), where FIG. 5(v)(A) is a cross-section taken along the line A-A' in FIG. 5(B). As can be seen in FIGS. 5(v)(A) and 5(v)(B), a silicon germanium slab 507 is retained.

The etch is performed so that a space, x, from a sidewall of the cavity to the beginning of a taper region to the 3 µm waveguide is provided. This allows the bonding steps, discussed in detail below, to be more flexible in alignment. Portions of the upper surface of the device are covered by silicon dioxide covering 508.

Subsequently, in a step the results of which are shown in FIGS. 5(vi)(A) and 5(vi)(B), doped regions are added to the silicon germanium rib waveguide 506 and slab 507. FIG. 5(vi)(A) is a cross-section taken along the line A-A' of FIG. 5(vi)(B). As can be seen, sidewalls of the silicon germanium rib waveguide 506 are doped. On one side, a p-type species of dopant is used to provide a p doped region 509 which extends down the sidewall. On the other side, an n-type species of dopant is used to provide an n doped region 511 which extends down the sidewall. A vertical p-i-n junction is thereby provided. A portion of the slab is heavily doped with a p-type species of dopant, to provide a p+ doped region 510 in the slab. Similarly, a portion of the slab is heavily doped with an n-type species of dopant, to provide an n+ doped region 513 in the slab.

After this, a silicon dioxide layer 515 is disposed over the exposed surfaces of the device and vias are opened above the p+ doped region 510 and n+ doped regions 512. A metallization step is performed, so as to provide a p-electrode 513 and n-electrode 514 which electrically connect to the p+ doped region 510 and n+ doped region 512 respectively. The result of this is shown in FIG. 5(vii)(A) and (B), FIG. 5(vii)(A) being a cross-section of FIG. 5(vii)(B) along the line A-A'. Next, in a step shown in FIGS. 5(viii)(A) and 5(viii)(B), a silicon nitride layer 516 is disposed to cover the electrodes 513 and 514. As is shown in FIG. 5(viii)(B) bonding areas 517 located at lateral ends of the device are left exposed. As before, FIG. 5(viii)(A) is a cross-section view along the line A-A' in FIG. 5(viii)(B).

Next, in a step shown in FIG. 5(*ix*)(A), a second SOI wafer is prepared. The second SOI wafer in this example has a 10 μm device layer 518 located above a buried oxide layer 519, which is supported by substrate 520. A cavity 521 is etched, the cavity corresponding in location and size to the cavity 503 etched previously. As before, FIG. 5(*ix*)(A) is a cross-section along the line A-A' shown in FIG. 5(*ix*)(B).

Subsequently, the second SOI wafer is bonded to the bonding areas 517 of the first SOI wafer. The second SOI wafer is inverted, and the 10 μm device layer 518 is placed in contact with the bonding areas 517 of the first SOI wafer. A plasma assisted bonding process is used, with an annealing temperature of at least 300° C. The result is shown in FIG. 5(*x*), where 10 μm device layer 517 is bonded to the silicon device layer 501 of the first SOI wafer. The distance x, between the silicon nitride 516 and a sidewall of the 10 μm device layer 518 may be 1 mm or up to around 1 cm to facilitate bonding alignment.

After the wafer bonding step, the silicon substrate 520 is removed either by a chemical-mechanical planarization process or a dry etch. The result of this is shown in FIG. 5(*xi*). Subsequently, in a step the result of which is shown in FIG. 5(*xii*), the buried oxide layer 519 is removed either by a chemical-mechanical planarization process or a wet etch. This then allows a hard mask 522 to be disposed over a portion of the upper surface of the structure, for an etching step used to produce the 13 μm to 3 μm tapered waveguide. FIG. 5(*xiii*) shows a cross-section through the line A-A' discussed previously after the hard mask 522 has been provided.

The hard mask 522 is then patterned, and the 13 μm to 3 μm tapered waveguide is etched. This is shown in FIGS. 5(*xiv*)(A) and 5(*xiv*)(B), where 5(*xiv*)(A) is a cross-section along the line A-A' in 5(*xiv*)(B). The hard mask is then removed, as well as the silicon nitride layer 516, after which a silicon dioxide top cladding layer 523 is deposited above the upper surface of at least the waveguides. This is shown in FIG. 5(*xv*)(A), which is a cross-sectional view along the line A-A' of FIG. 5(*xv*)(B). Note that the top cladding is omitted in FIG. 5(*xv*)(B) for clarity. Next, in a step shown in Figure (xvi)(A), the silicon dioxide top cladding layer 523 above the p-electrode 513 and the n-electrode 514 is removed to allow electrical contacts to be connected to the respective electrodes.

Figure 6I:
FIGS. 6(i)-6(viii)(B) show various manufacturing stages to prepare an optoelectronic device for integration with a mode converter.
Figure 6:
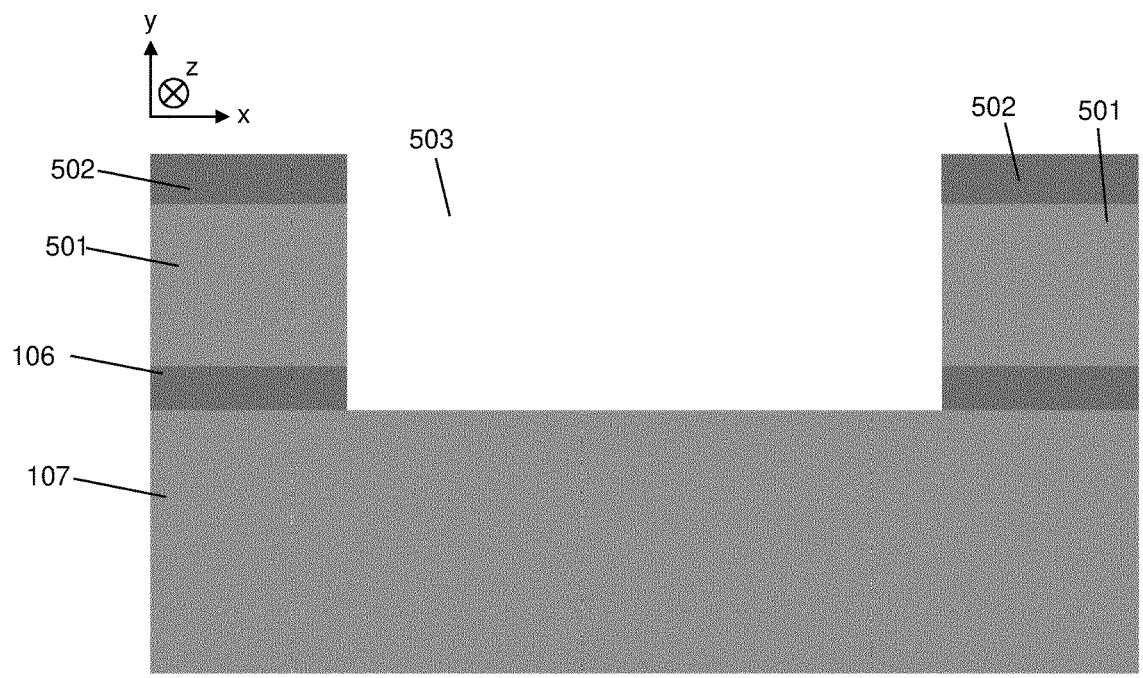
Figure 6:
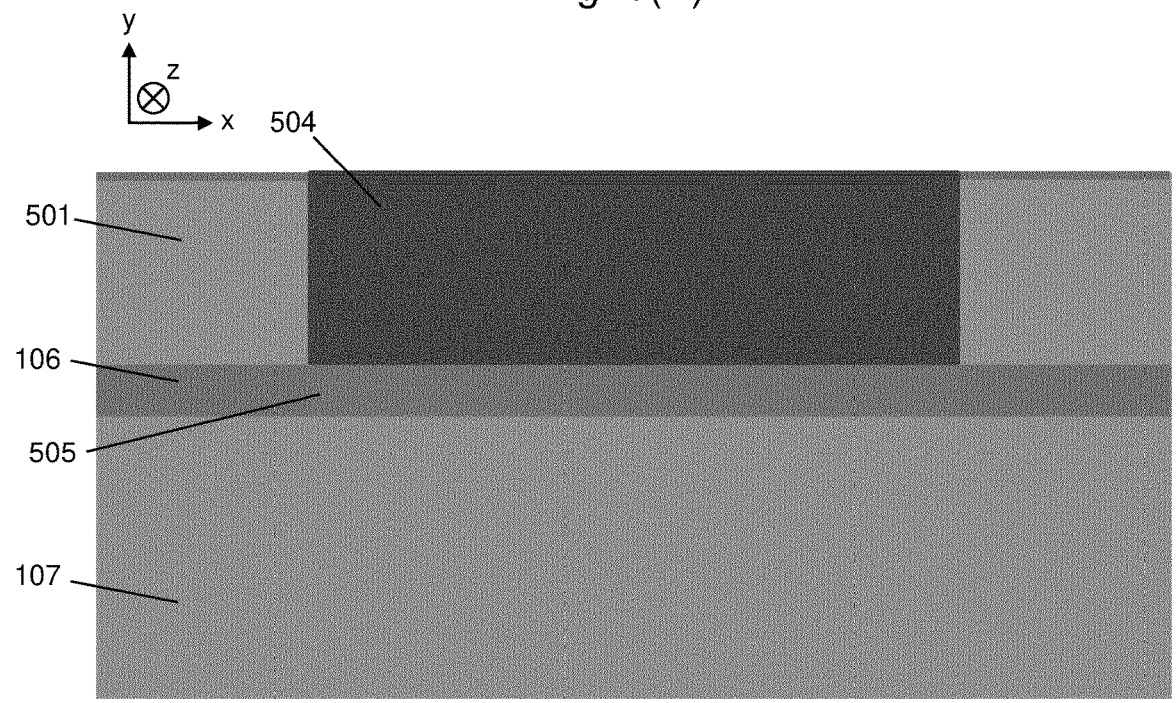
Figure 6V:
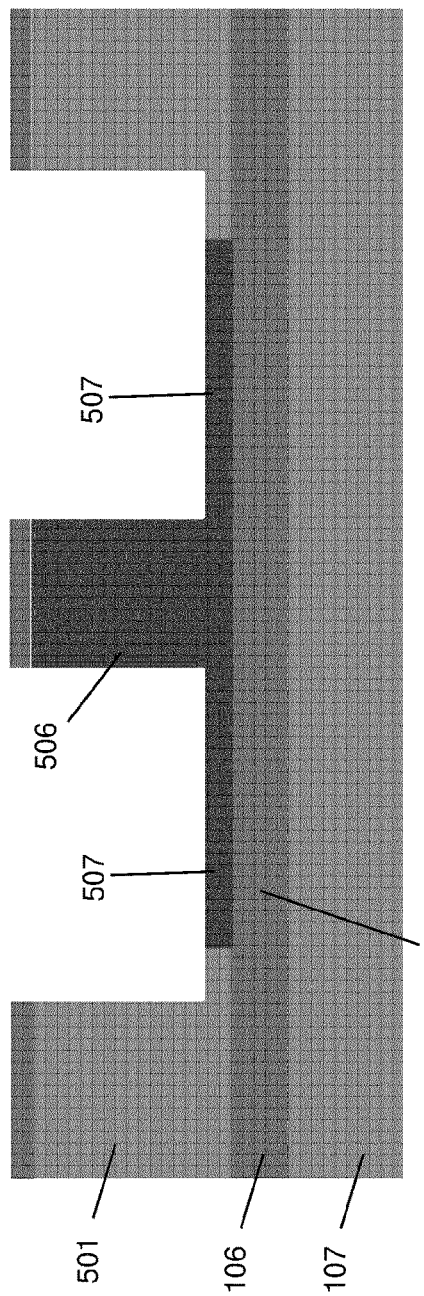
Figure 6V:
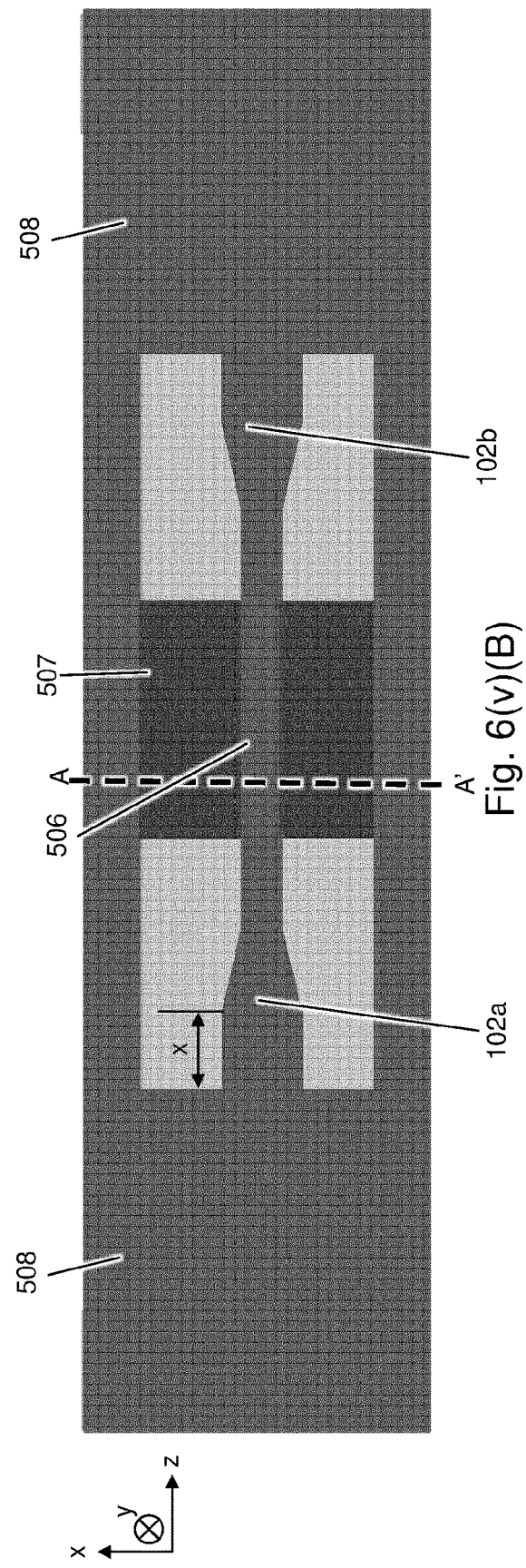

FIGS. 6(*i*)-6(*viii*)(B) show various manufacturing stages to prepare an optoelectronic device for integration with a mode converter. They correspond to the steps shown in FIGS. 5(*i*) to 5(*vii*) discussed above. In a first step, shown in FIG. 6(*i*), a silicon-on-insulator, SOI, wafer is provided. The SOI wafer comprises a silicon device layer 501, which is above a buried oxide layer 106. The buried oxide layer is between the silicon device layer 501 and a silicon substrate 107.

Next, in a step shown in FIG. 6(*ii*), a hard mask 502 is provided over a portion of the upper surface, and a cavity 503 is etched through the silicon device layer and also through the buried oxide layer. This etch may be performed in two-steps, a first using the buried oxide layer as an etch stop, and a second using the silicon substrate as an etch stop. After this etch, a silicon cladding layer 505 is grown from the silicon substrate, and a silicon germanium stack 504 is epitaxially grown on top of the silicon cladding layer. This is shown in FIG. 6(*iii*). The silicon cladding layer has a composition such that it functions as a bottom cladding layer for a waveguide subsequently formed from the silicon germanium stack 504. For example, the silicon cladding layer may have a composition such that the refractive index of the cladding layer is lower than that of the silicon germanium stack.

After the silicon germanium stack 504 is provided, it is planarized relative to surrounding surfaces via a chemical-mechanical planarian process. The result of this is shown in FIG. 6(*iv*). Next, a portion of the silicon device layer and the silicon germanium stack are etched to provide silicon rib waveguides 102a and 102b either end of, and which couple into, a silicon germanium rib waveguide 506. This is shown in FIGS. 6(*v*)(A) and 6(*v*)(B), where FIG. 6(*v*)(A) is a cross-section taken along the line A-A' in FIG. 6(B). As can be seen in FIGS. 6(*v*)(A) and 6(*v*)(B), a silicon germanium slab 507 is retained.

The etch is performed so that a space, x, from a sidewall of the cavity to the beginning of a taper region to the 3 μm waveguide is provided. This allows the bonding steps, discussed in detail below, to be more flexible in alignment. Portions of the upper surface of the device are covered by silicon dioxide covering 508.

Subsequently, in a step the results of which are shown in FIGS. 6(*vi*)(A) and 6(*vi*)(B), doped regions are added to the silicon germanium rib waveguide 506 and slab 507. FIG. 6(*vi*)(A) is a cross-section taken along the line A-A' of FIG. 6(*vi*)(B). As can be seen, sidewalls of the silicon germanium rib waveguide 506 are doped. On one side, a p-type species of dopant is used to provide a p doped region 509 which extends down the sidewall. On the other side, an n-type species of dopant is used to provide an n doped region 511 which extends down the sidewall. A vertical p-i-n junction is thereby provided. A portion of the slab is heavily doped with a p-type species of dopant, to provide a p+ doped region 510 in the slab. Similarly, a portion of the slab is heavily doped with an n-type species of dopant, to provide an n+ doped region 513 in the slab.

After this, a silicon dioxide layer 515 is disposed over the exposed surfaces of the device and vias are opened above the p+ doped region 510 and n+ doped regions 512. A metallization step is performed, so as to provide a p-electrode 513 and n-electrode 514 which electrically connect to the p+ doped region 510 and n+ doped region 512 respectively. The result of this is shown in FIG. 6(*vii*)(A) and (B), FIG. 6(*vii*)(A) being a cross-section of FIG. 6(*vii*)(B) along the line A-A'. After the electrodes have been provided, bonding areas 517 at either end of the device are opened as is shown in FIG. 6(*viii*)(B). The structure is then ready for integration with the mode converter fabricated with reference to FIGS. 7(*i*)-7(*v*)(B).

Figure 7I:
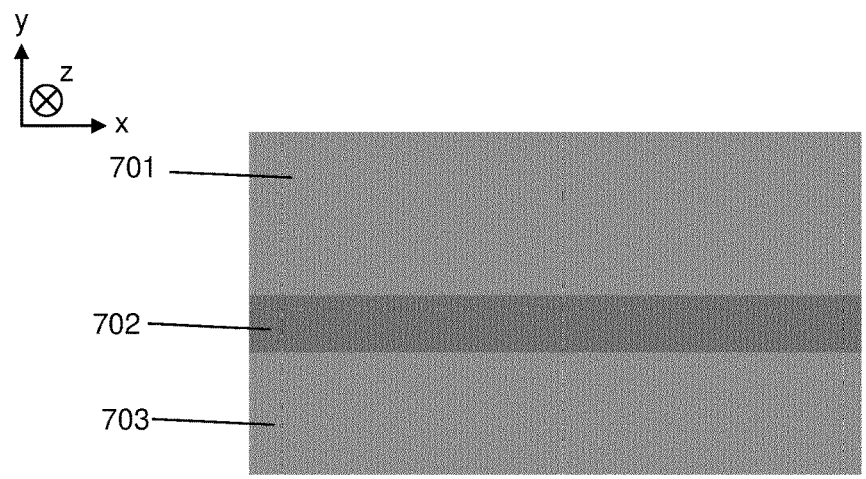
FIGS. 7(i)-7(v)(B) show various manufacturing stages to prepare a mode converter for integration with an optoelectronic device.
Figure 7:
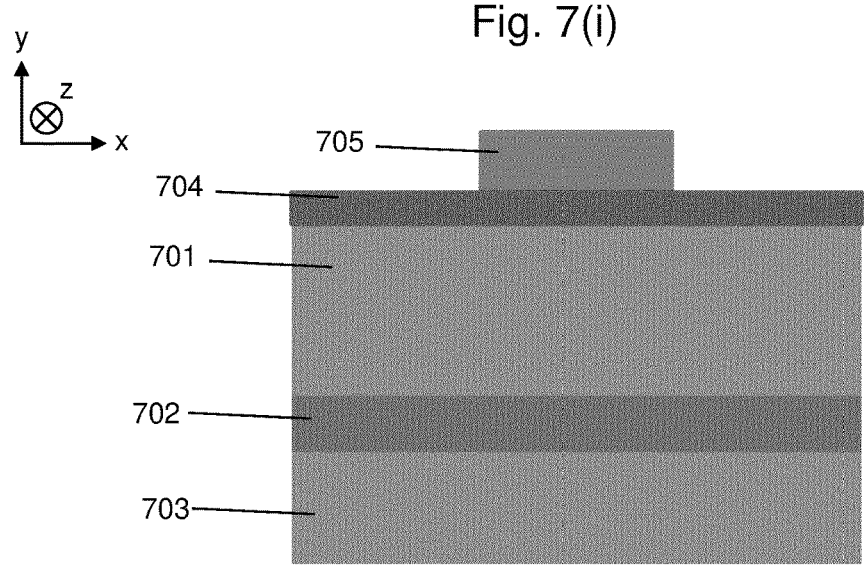
Figure 7:
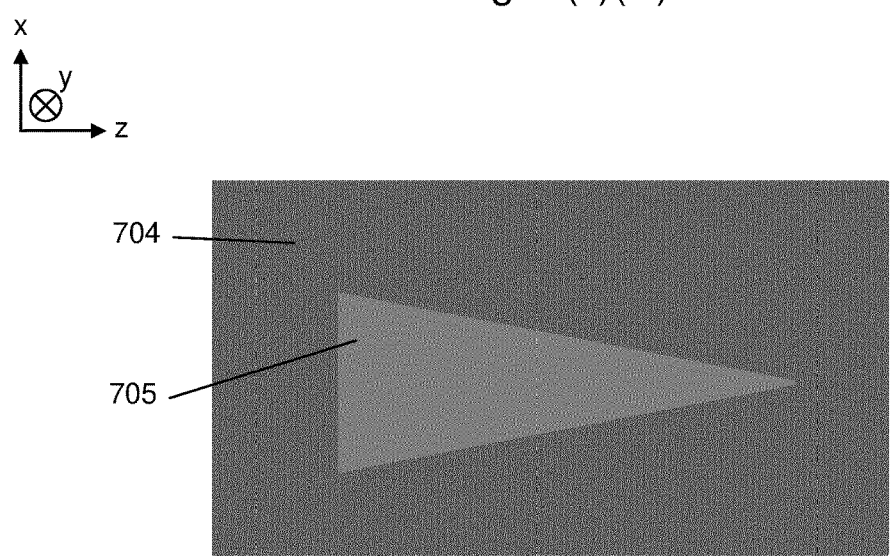
Figure 7V:
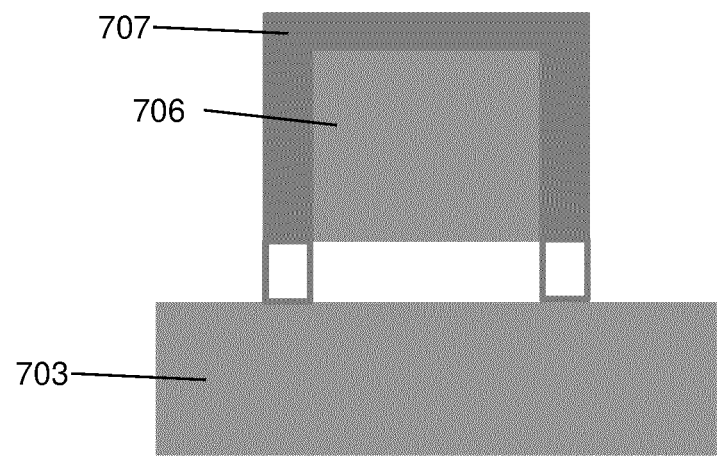
Figure 7V:
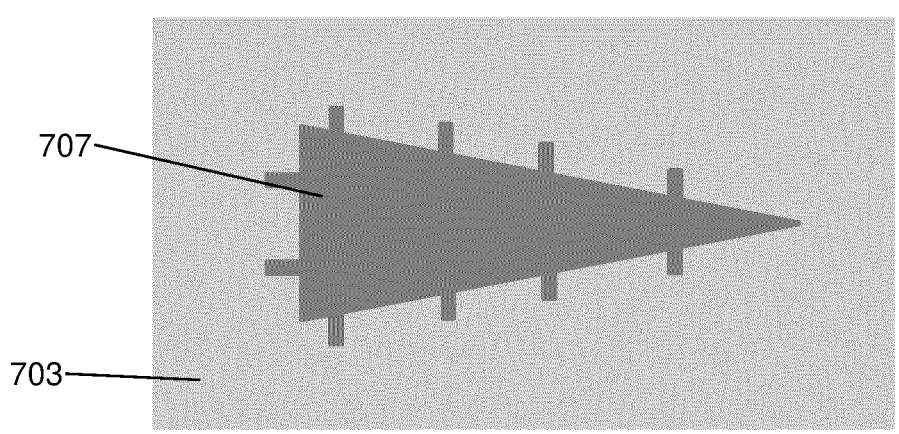

FIGS. 7(*i*)-7(*v*)(B) show various manufacturing stages to prepare a mode converter for integration with an optoelectronic device. In a first step, shown in FIG. 7(*i*) an SOI wafer is provided comprising: a 10 μm silicon device layer 701, a buried oxide layer 702, and a silicon substrate 703. Next in a step shown in FIG. 7(*ii*)(A), a cross-section view, and 7(*ii*)(B), a top-down view, a silicon dioxide hard mask 704 is provided and a photoresist 705 provided and patterned on top of the hard mask 704. The photoresist 705 has a triangular geometry, so as to define a waveguide tapering from a first width to a second width.

The etch is then performed, resulting in a structure shown in FIGS. 7(*iii*)(A) and 7(*iii*)(B), where FIG. 7(*iii*)(A) is a cross-section view through the structure of FIG. 7(*iii*)(B). A tapered waveguide 706 is shown, resulting from the etch. The photoresist has been removed. A further etch is performed, to remove the hard mask and also the exposed regions of the buried oxide layer 702, i.e. those portions of the buried oxide layer not sandwiched between the waveguide 706 and substrate 703. The result of this subsequent etch is shown in FIGS. 7(iv)(A) and 7(iv)(B), FIG. 7(iv) being a cross-section view through the structure of 7(iv)(B).

Next, a photoresist tether 707 is disposed on the lateral sides and upper surface of the waveguide 706. This facilitates a further etch, which removes the remaining buried oxide layer, and leaves the waveguide 706 tethered to the silicon substrate 703 only be photoresist tether 707. The waveguide 706 can then be printed via a micro-transfer printing process, e.g. through attaching to an elastomer stamp.

Figure 8:
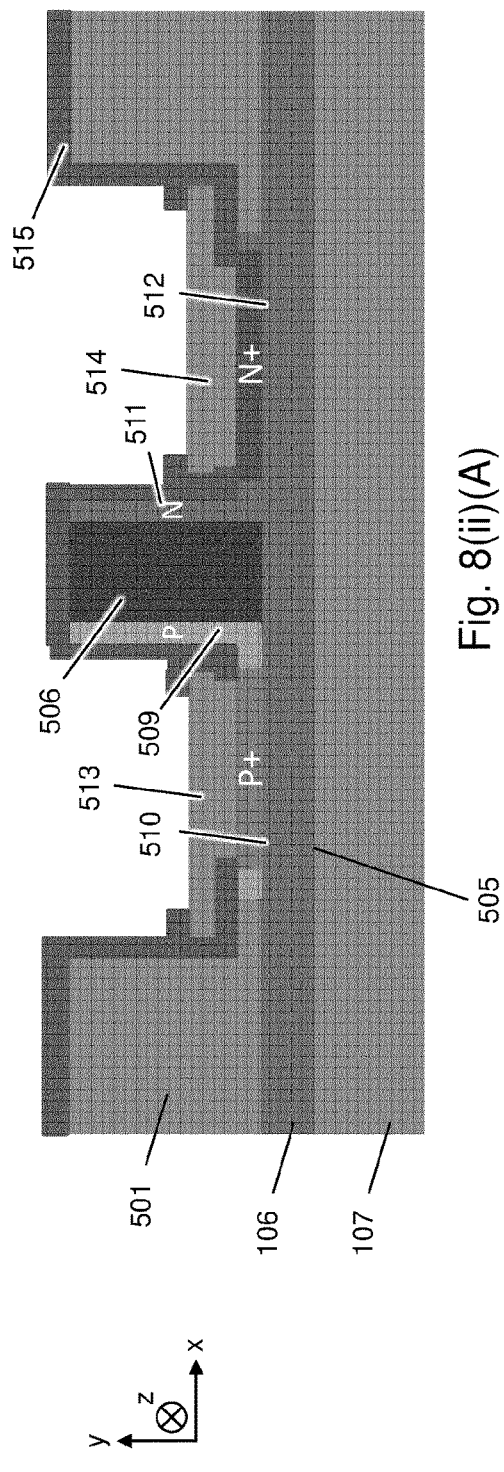
FIGS. 8(i)(A)-8(ii)(B) show an integration process of a mode converter with an optoelectronic device.
Figure 8:
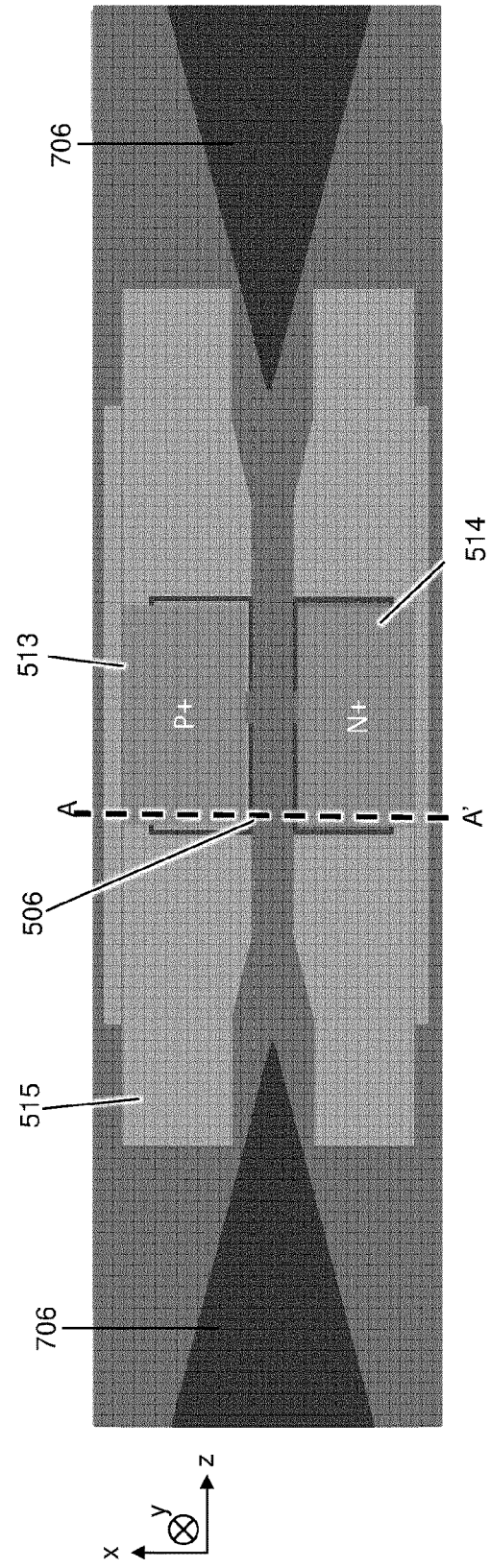

FIGS. 8(i)(A)-8(ii)(B) show an integration process of a mode converter with an optoelectronic device. The waveguide 706 is printed via the micro-transfer printing process to bonding area 517 of the structure shown in FIG. 6(viii)(B). Subsequently, in a step shown in FIG. 8(ii)(A) and FIG. 8(ii)(B), a silicon dioxide top cladding layer 515 is disposed over the upper surface of the structure, and openings are formed in the cladding for p-electrode 513 and n-electrode 514.

The steps above, notably fabrication of a mode converter and bonding to a separate structure, can be repeated to provide a plurality of mode conversion steps such as that shown in FIGS. 2A-4B. Alternatively, the adhesion of an inverted SOI wafer to the structure, as discussed with respect FIGS. 5(ix)(A)-5(xii) can also be repeated so as to provide a plurality mode converters. Each mode converter after the first being bonded to the previously bonded mode converter. Further alternatively, a single slab or mode converter may be bonded to the structure, and then multiple etching steps can be performed to provide the plurality of mode converters.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

LIST OF FEATURES

100 Photonic device
101 13 μm to 3 μm tapered waveguide
102 3 μm waveguide
103 Optoelectronic device
104 3 μm silicon slab
105 Silicon slab for 3 μm waveguide
106 Buried oxide layer
107 Silicon substrate
200 Photonic device
201 3 μm to 1 μm tapered waveguide
202 1 μm waveguide
203 Silicon slab for 1 μm waveguide
204 Optoelectronic device
205 1 μm silicon slab
300 Photonic device
301 3 μm to 800 nm tapered waveguide
302 800 nm waveguide
303 Silicon slab for 800 nm waveguide
304 Optoelectronic device
305 800 nm silicon slab
400 Photonic device
402 3 μm to 1.5 μm tapered waveguide
403 1.5 μm-0.22 μm tapered waveguide
404 0.22 μm tapered waveguide
405 Optoelectronic device
406 Silicon slab for 0.22 μm tapered waveguide
407 0.22 μm silicon slab
501 Silicon device layer
502 Hard mask
503 Cavity
504 Epitaxially grown silicon germanium
505 Epitaxially grown silicon cladding layer
506 Silicon germanium rib waveguide
507 Silicon germanium slab
508 Silicon dioxide covering
509 P doped sidewall
510 P+ doped slab
511 N doped sidewall
512 N+ doped slab
513 P electrode
514 N electrode
515 Silicon dioxide layer
516 Silicon nitride layer
517 Bonding area
518 10 μm silicon on insulator layer
519 Buried oxide layer
520 Silicon substrate
521 Cavity
522 Hard mask
523 Silicon dioxide cladding
701 10 μm silicon device layer
702 Buried oxide layer
703 Silicon substrate
704 Silicon dioxide hard mask
705 Photoresist
706 Tapered waveguide
707 Photoresist tether

The invention claimed is:

1. A method of manufacturing an optoelectronic device including a mode converter, the method having the steps of:
   on a first SOI wafer, manufacturing the optoelectronic device;
   on a second SOI wafer, manufacturing the mode converter; and
   bonding the mode converter to the first SOI wafer.

2. The method of claim 1, wherein manufacturing the mode converter on the second SOI wafer includes the steps of:
   disposing a first photoresist over a portion of a device layer of the second SOI wafer; and
   etching the exposed regions of the device layer to form the mode converter.

3. The method of claim 1, wherein the mode converter is formed as a tapered waveguide, which decreases in width along a direction parallel to the guiding direction of the waveguide.

4. The method of any of claim 1, wherein manufacturing the mode converter on the second SOI wafer includes a step of preparing the second SOI wafer for a micro-transfer printing process.

5. The method of claim 4, wherein preparing the second SOI wafer for the micro-transfer printing process includes a step of:
   patterning a tether onto the mode converter; and
   removing an insulator layer between the mode converter and a silicon substrate of the second SOI wafer thereby leaving the mode converter suspended via the tether.

6. The method of claim 1, wherein the step of manufacturing the mode converter on the second SOI wafer is performed before, or simultaneously with, the step of manufacturing the optoelectronic device on the first SOI wafer.

7. The method of claim 1, wherein bonding the mode converter to the first wafer is performed via a micro-transfer printing process.

8. The method of claim 7, wherein the micro-transfer printing process includes a plasma treatment step and an annealing step, to bond the mode converter to a bonding region of the first wafer.

9. The method of claim 1, wherein manufacturing the optoelectronic device includes the step(s) of:
manufacturing an input waveguide and/or an output waveguide on the first SOI wafer.

10. The method of claim 1, wherein the optoelectronic device is: an electro-optic modulator, a laser, a detector, an arrayed waveguide grating, an echelle grating, a Mach-Zehnder interferometer, a ring resonator, or any combination thereof.

11. The method of claim 1, wherein the optoelectronic device is an electro-optic modulator, a laser, or a detector, and manufacturing the optoelectronic device includes the steps of:
etching a device cavity into a device layer of the first SOI wafer; and
growing an optically active region in the device cavity.

12. The method of claim 11, wherein manufacturing the optoelectronic device further includes the step of:
etching the grown optically active region in the device cavity to form an optically active waveguide.

13. The method of claim 12, wherein the optoelectronic device is an electro-optic modulator or a detector, and manufacturing the optoelectronic device further includes:
doping two or more regions of the optically active waveguide; and
disposing an electrode in electrical contact with a respective doped region of the optically active waveguide.

14. The method of claim 1, wherein manufacturing the optoelectronic device further includes a step, performed before bonding the second wafer to the first wafer, of:
disposing a cover layer over the optoelectronic device, leaving one or more bonding regions, for bonding the first wafer to the second wafer, exposed.

15. The method of claim 1, including the step of manufacturing a further mode converter on the second SOI wafer or on another SOI wafer, and bonding said further mode converter to the first SOI wafer.

16. A method of manufacturing an optoelectronic device including a mode converter, the method having the steps of:
on a first SOI wafer, manufacturing an optoelectronic device;
bonding a second SOI wafer to the first SOI wafer to form a combined wafer; and
etching a mode converter into the combined wafer.

17. The method of claim 16, wherein manufacturing the optoelectronic device includes the step(s) of:
manufacturing an input waveguide and/or an output waveguide on the first SOI wafer.

18. The method of claim 16, wherein the optoelectronic device is: an electro-optic modulator, a laser, a detector, an arrayed waveguide grating, an echelle grating, a Mach-Zehnder interferometer, a ring resonator, or any combination thereof.

19. The method of claim 16, wherein the optoelectronic device is an electro-optic modulator, a laser, or a detector, and manufacturing the optoelectronic device includes the steps of:
etching a device cavity into a device layer of the first SOI wafer; and
growing an optically active region in the device cavity.

20. The method of claim 19, wherein manufacturing the optoelectronic device further includes the steps of:
etching the grown optically active region in the device cavity to form an optically active waveguide.

21. The method of claim 20, wherein the optoelectronic device is an electro-optic modulator or a detector, and manufacturing the optoelectronic device further includes:
doping two or more regions of the optically active waveguide; and
disposing an electrode in electrical contact with a respective doped region of the optically active waveguide.

22. The method of claim 16, wherein manufacturing the optoelectronic device further includes a step, performed before bonding the second wafer to the first wafer, of:
disposing a cover layer over the optoelectronic device, leaving one or more bonding regions, for bonding the first wafer to the second wafer, exposed.

23. The method of claim 16, wherein prior to bonding the second SOI wafer to the first SOI wafer, a step is performed of:
etching a second cavity into a device layer of the second SOI wafer.

24. The method of claim 23, wherein bonding the second SOI wafer to the first SOI wafer includes the steps of:
inverting the second SOI wafer, and disposing it on an upper surface of the first SOI wafer.

25. The method of claim 16, wherein, in a further step, a silicon substrate of the second SOI wafer is removed after the second SOI wafer is bonded to the first SOI wafer.

* * * * *